(12) United States Patent
Yuan et al.

(10) Patent No.: US 11,398,179 B2
(45) Date of Patent: Jul. 26, 2022

(54) SHIFT REGISTER UNIT, GATE DRIVE CIRCUIT AND DRIVING METHOD THEREOF, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Zhidong Yuan, Beijing (CN); Yongqian Li, Beijing (CN); Xuehuan Feng, Beijing (CN); Can Yuan, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 365 days.

(21) Appl. No.: 16/500,625

(22) PCT Filed: Feb. 27, 2019

(86) PCT No.: PCT/CN2019/076345
§ 371 (c)(1),
(2) Date: Oct. 3, 2019

(87) PCT Pub. No.: WO2020/007054
PCT Pub. Date: Jan. 9, 2020

(65) Prior Publication Data
US 2021/0335199 A1    Oct. 28, 2021

(30) Foreign Application Priority Data
Jul. 3, 2018    (CN) .......................... 201810719414.8

(51) Int. Cl.
*G09G 3/20*    (2006.01)

(52) U.S. Cl.
CPC ... *G09G 3/2092* (2013.01); *G09G 2300/0426* (2013.01); *G09G 2310/0286* (2013.01);
(Continued)

(58) Field of Classification Search
CPC ................... G09G 3/20; G09G 3/2092; G09G 2300/0426; G09G 2310/0286;
(Continued)

(56) References Cited

U.S. PATENT DOCUMENTS 9,905,161 B2 *   2/2018   Jeon ................... G11C 19/28
10,825,539 B2 * 11/2020   Feng .................... G09G 3/3208
(Continued)

FOREIGN PATENT DOCUMENTS

CN          104900211 A         9/2015
CN          106098102 A        11/2016
(Continued)

*Primary Examiner* — Amare Mengistu
*Assistant Examiner* — Jennifer L Zubajlo
(74) *Attorney, Agent, or Firm* — Banner & Witcoff, Ltd.

(57) ABSTRACT

A shift register unit, a gate drive circuit, a display device and a driving method are provided. The shift register unit includes a sub-shift register, a second sub-shift register and an output control circuit. The first sub-shift register includes a first output terminal and a first control node, and is configured to output a first clock signal under control of a level of the first control node. The second sub-shift register include a second output terminal and a second control node, and the second output terminal outputs a display output signal in a display phase and a random output signal in a blank phase under control of a level of the second control node. The output control circuit is connected to the first sub-shift register and the second control node, and is configured to control the level of the second control node under control of an output control signal.

18 Claims, 13 Drawing Sheets

(52) U.S. Cl.
CPC ... *G09G 2310/061* (2013.01); *G09G 2310/08* (2013.01); *G09G 2320/0214* (2013.01)

(58) Field of Classification Search
CPC ......... G09G 2310/061; G09G 2310/08; G09G 2320/0214
See application file for complete search history.

(56) References Cited

U.S. PATENT DOCUMENTS

| | | | |
|---|---|---|---|
| 10,998,067 B2* | 5/2021 | Feng | G11C 19/28 |
| 2003/0076289 A1* | 4/2003 | Tokonami | G09G 3/3614 |
| | | | 345/100 |
| 2017/0076683 A1* | 3/2017 | Lee | G06F 3/04166 |
| 2017/0178584 A1* | 6/2017 | Ma | G09G 3/3696 |
| 2018/0337682 A1* | 11/2018 | Takasugi | H03K 21/18 |
| 2020/0035316 A1* | 1/2020 | Feng | G11C 19/28 |
| 2020/0372965 A1* | 11/2020 | Yuan | G11C 7/12 |

FOREIGN PATENT DOCUMENTS

| | | |
|---|---|---|
| CN | 108597438 A | 9/2018 |
| JP | 2000035559 A | 2/2000 |
| KR | 20170078978 A | 7/2017 |

* cited by examiner

SHIFT REGISTER UNIT, GATE DRIVE CIRCUIT AND DRIVING METHOD THEREOF, AND DISPLAY DEVICE

This application is a U.S. National Phase Entry of International Application No. PCT/CN2019/076345, filed on Feb. 27, 2019, designating the United States of America and claiming priority to Chinese Patent Application No. 201810719414.8, filed on Jul. 3, 2018. The present application claims priority to and the benefit of the above-identified applications and the above-identified applications are incorporated by reference herein in their entirety.

TECHNICAL FIELD

Embodiments of the present disclosure relate to a shift register unit, a gate drive circuit and a driving method thereof, and a display device.

BACKGROUND

In the field of display technologies, a pixel array of, for example, a liquid crystal display panel or an organic light emitting diode (OLED) display panel generally includes a plurality of rows of gate lines and a plurality of columns of data lines crossed with the gate lines. The gate lines can be driven by a bonded integrated drive circuit. In recent years, with the continuous improvement of preparation processes of amorphous silicon thin film transistors or oxide thin film transistors, a gate line drive circuit can be directly integrated on a thin film transistor array substrate to form a GOA (Gate driver On Array) to drive the gate lines. For example, a GOA including a plurality of cascaded shift register units can be used to provide on-off state voltage signals for the plurality of rows of gate lines connected to the pixel array, so as to control, for example, the plurality of rows of gate lines to be turned on sequentially, and at the same time, data signals are provided by data lines to pixel units, in a corresponding row, of the pixel array, to generate gray voltages required by respective gray scales of a display image in respective pixel units, thereby displaying one frame of image. Nowadays, more and more display panels use GOA technologies to drive the gate lines. The GOA technologies contribute to achieve the design of narrow frame of the display panels and can reduce production costs of the display panels.

SUMMARY

At least one embodiment of the present disclosure provides a shift register unit, which includes a first sub-shift register, a second sub-shift register and an output control circuit. The first sub-shift register comprises a first output terminal, and is configured to output a first clock signal under control of a level of a first control node; the second sub-shift register comprises a second output terminal, and is configured so that the second output terminal outputs a display output signal in a display phase and outputs a random output signal in a blank phase under control of a level of a second control node; and the output control circuit is connected to the first sub-shift register and the second control node, and is configured to control the level of the second control node under control of an output control signal.

For example, the shift register unit provided by an embodiment of the present disclosure further includes a composite output circuit and a third output terminal. The composite output circuit is connected to the output control circuit, the second control node, and the third output terminal, and is configured so that the third output terminal outputs the display output signal in the display phase and outputs the random output signal in the blank phase under control of the level of the second control node.

For example, in the shift register unit provided by an embodiment of the present disclosure, the output control signal comprises the level of the first control node and the first clock signal, and the output control circuit comprises a first transistor and a second transistor. A gate electrode of the first transistor is connected to the first control node, a first electrode of the first transistor is connected to a first clock signal terminal to receive the first clock signal, and a second electrode of the first transistor is connected to a gate electrode of the second transistor; and a first electrode of the second transistor is connected to a second clock signal terminal to receive a second clock signal, or the first electrode of the second transistor is connected to the gate electrode of the second transistor, and a second electrode of the second transistor is connected to the second control node of the second sub-shift register.

For example, in the shift register unit provided by an embodiment of the present disclosure, the output control circuit further comprises a third transistor; a gate electrode of the third transistor is connected to a third control node, a first electrode of the third transistor is connected to the gate electrode of the second transistor, and a second electrode of the third transistor is connected to a first voltage terminal to receive a first voltage.

For example, in the shift register unit provided by an embodiment of the present disclosure, the output control signal comprises the first clock signal output from the first output terminal, and the output control circuit comprises a first transistor. A gate electrode of the first transistor is connected to the first output terminal of the first sub-shift register, a first electrode of the first transistor is connected to a second clock signal terminal to receive a second clock signal, and a second electrode of the first transistor is connected to the second control node.

For example, in the shift register unit provided by an embodiment of the present disclosure, the composite output circuit comprises a fourth transistor. A gate electrode of the fourth transistor is connected to the second control node, a first electrode of the fourth transistor is connected to a third clock signal terminal to receive a third clock signal, and a second electrode of the fourth transistor is connected to the third output terminal; and the third clock signal comprises the display output signal and the random output signal.

For example, in the shift register unit provided by an embodiment of the present disclosure, the composite output circuit further comprises a fifth transistor. A gate electrode of the fifth transistor is connected to a fourth control node, a first electrode of the fifth transistor is connected to the third output terminal, and a second electrode of the fifth transistor is connected to a first voltage terminal to receive a first voltage.

For example, in the shift register unit provided by an embodiment of the present disclosure, the first sub-shift register comprises a first input circuit, a first control node reset circuit, and a first output circuit. The first input circuit is configured to charge the first control node in response to a first input signal; the first control node reset circuit is configured to reset the first control node in response to a first reset signal; and the first output circuit is configured to output the first clock signal to the first output terminal under control of the level of the first control node.

For example, in the shift register unit provided by an embodiment of the present disclosure, the first sub-shift register further comprises a first inverter circuit, a first control node noise reduction circuit, and a first output noise reduction circuit. The first inverter circuit is configured to control a level of a third control node under control of the level of the first control node; the first control node noise reduction circuit is configured to perform noise reduction on the first control node under control of the level of the third control node; and the first output noise reduction circuit is configured to perform noise reduction on the first output terminal under control of the level of the third control node.

For example, in the shift register unit provided by an embodiment of the present disclosure, the first sub-shift register further comprises a first leakage protection circuit. The first leakage protection circuit is configured to maintain a high potential of the first control node under control of the first clock signal output from the first output terminal.

For example, in the shift register unit provided by an embodiment of the present disclosure, the first leakage protection circuit comprises an eleventh transistor, a twelfth transistor, a thirteenth transistor, and a fourteenth transistor. A gate electrode of the eleventh transistor is connected to a first input terminal to receive the first input signal, a first electrode of the eleventh transistor is connected to a second electrode of the fourteenth transistor, and a second electrode of the eleventh transistor is connected to the first control node; a gate electrode of the twelfth transistor is connected to a first reset terminal to receive the first reset signal, a first electrode of the twelfth transistor is connected to the second electrode of the fourteenth transistor, and a second electrode of the twelfth transistor is connected to a first voltage terminal to receive a first voltage; a gate electrode of the thirteenth transistor is connected to the third control node, a first electrode of the thirteenth transistor is connected to the second electrode of the fourteenth transistor, and a second electrode of the thirteenth transistor is connected to the first voltage terminal to receive the first voltage; and a gate electrode of the fourteenth transistor is connected to the first output terminal, and a first electrode of the fourteenth transistor is connected to the first clock signal terminal to receive the first clock signal.

For example, in the shift register unit provided by an embodiment of the present disclosure, the second sub-shift register comprises a second input circuit, a second control node reset circuit, and a second output circuit. The second input circuit is configured to charge the second control node in response to a second input signal; the second control node reset circuit is configured to reset the second control node in response to a second reset signal; and the second output circuit is configured to output a third clock signal to the second output terminal under control of the level of the second control node; and the third clock signal comprises the display output signal and the random output signal.

For example, in the shift register unit provided by an embodiment of the present disclosure, the second sub-shift register comprises a second inverter circuit, a second control node noise reduction circuit, and a second output noise reduction circuit. The second inverter circuit is configured to control a level of a fourth control node under control of the level of the second control node; the second control node noise reduction circuit is configured to perform noise reduction on the second control node under control of the level of the fourth control node; and the second output noise reduction circuit is configured to perform noise reduction on the second output terminal under control of the level of the fourth control node.

For example, in the shift register unit provided by an embodiment of the present disclosure, the second sub-shift register further comprises a second leakage protection circuit. The second leakage protection circuit is configured to maintain a high potential of the second control node under control of the third clock signal output from the second output terminal.

For example, in the shift register unit provided by an embodiment of the present disclosure, the second leakage protection circuit comprises a twenty-sixth transistor, a twenty-seventh transistor, a twenty-eighth transistor, and a twenty-ninth transistor. A gate electrode of the twenty-sixth transistor is connected to a second input terminal to receive the second input signal, a first electrode of the twenty-sixth transistor is connected to a second electrode of the twenty-ninth transistor, and a second electrode of the twenty-sixth transistor is connected to the second control node; a gate electrode of the twenty-seventh transistor is connected to a second reset terminal to receive the second reset signal, a first electrode of the twenty-seventh transistor is connected to the second electrode of the twenty-ninth transistor, and a second electrode of the twenty-seventh transistor is connected to a first voltage terminal to receive the first voltage; a gate electrode of the twenty-eighth transistor is connected to the fourth control node, a first electrode of the twenty-eighth transistor is connected to the second electrode of the twenty-ninth transistor, and a second electrode of the twenty-eighth transistor is connected to the first voltage terminal to receive the first voltage; and a gate electrode of the twenty-ninth transistor is connected to the second output terminal, and a first electrode of the twenty-ninth transistor is connected to a third clock signal terminal to receive the third clock signal.

For example, the shift register unit provided by an embodiment of the present disclosure, further comprises a total reset circuit; and the total reset circuit is configured to reset the second control node under control of the third reset signal.

For example, the shift register unit provided by an embodiment of the present disclosure, the total reset circuit comprises a thirtieth transistor. A gate electrode of the thirtieth transistor is connected to a third reset terminal to receive the third reset signal, a first electrode of the thirtieth transistor is connected to a first voltage terminal to receive a first voltage, and a second electrode of the thirtieth transistor is connected to the second control node.

At least one embodiment of the present disclosure further provides a gate drive circuit, which includes a plurality of cascaded shift register units provided by any one of embodiments of the present disclosure, the output control circuit is electrically connected to the first sub-shift register and the second sub-shift register; except for a first stage of first sub-shift register, a first input terminal of each stage of remaining first sub-shift registers is connected to a first output terminal of a previous stage of first sub-shift register; except for a last stage of first sub-shift register, a first reset terminal of each stage of remaining first sub-shift registers is connected to a first output terminal of a next stage of first sub-shift register; except for a first stage of second sub-shift register, a second input terminal of each stage of remaining second sub-shift registers is connected to a second output terminal of a previous stage of second sub-shift register; and except for a last stage of second sub-shift register, a second reset terminal of each stage of remaining second sub-shift registers is connected to a second output terminal of a next stage of second sub-shift register.

At least one embodiment of the present disclosure further provides a display device, which includes the gate drive circuit provided by any one of embodiments of the present disclosure.

For example, the display device provided by an embodiment of the present disclosure further includes a display panel, the display panel comprises a plurality of sub-pixel units arranged in an array, and the array comprises N rows, the gate drive circuit comprises N cascaded shift register units, and second output terminals of the N cascaded shift register units are respectively connected, in one-to-one correspondence, to the N rows of sub-pixel units, so as to output display output signals to the N rows of sub-pixel units line by line in the display phase and output random output signals to one of the N rows of sub-pixel units in the blank phase; and N is an integer greater than 1.

At least one embodiment of the present disclosure also provides a driving method of the gate drive circuit, which includes: in the display phase, outputting the display output signal from the second output terminal of the second sub-shift register; and in the blank phase, outputting the random output signal from the second output terminal of the second sub-shift register.

For example, in the driving method provided by an embodiment of the present disclosure, in a case of comprising a composite output circuit and a third output terminal, the driving method further comprises: in the display phase, outputting the display output signal from the third output terminal; and in the blank phase, outputting the random output signal from the third output terminal.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the absolute position of the object which is described is changed, the relative position relationship may be changed accordingly.

Pixel circuits in OLED display devices generally adopt a matrix drive mode, the matrix drive mode is divided into an active matrix drive mode and a passive matrix drive mode according to whether a switching element is introduced into each pixel unit. AMOLED integrates a group of thin film transistors and storage capacitors in a pixel circuit of each pixel unit. Through the drive control of the thin film transistors and storage capacitors, a current flowing through the OLED is controlled, so that the OLED emits light as required. The basic pixel circuit used in AMOLED display device is usually a 2T1C pixel circuit, that is, two thin-film transistors (TFT) and a storage capacitor Cst are used to realize the function of driving OLED to emit light.

Figure 1A:
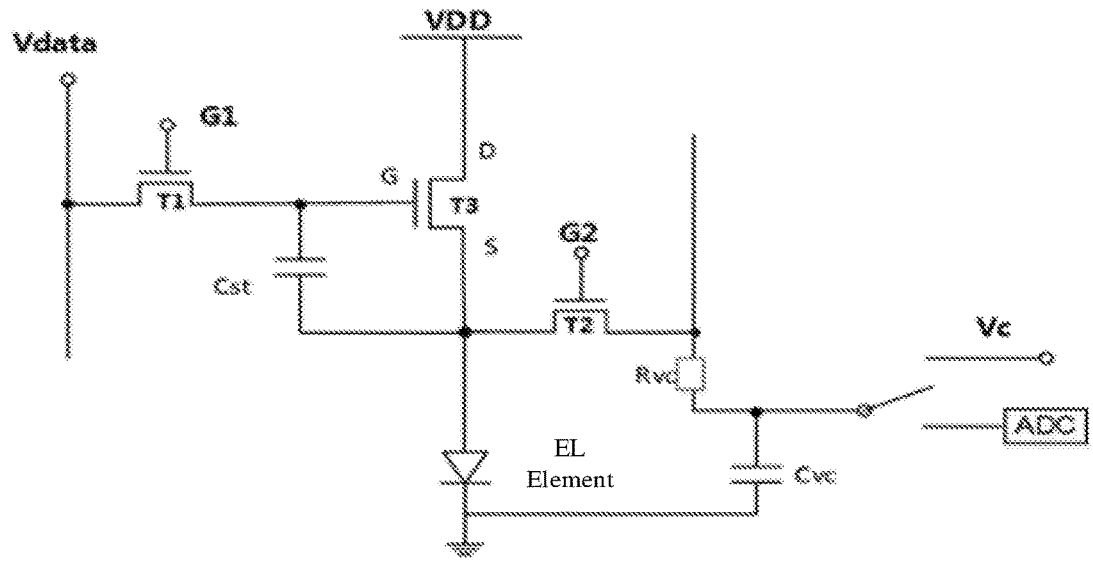
FIG. 1A is a schematic diagram of a pixel circuit.

In common OLED display panels, compensation technology is often needed to improve the display quality. In a case of compensating sub-pixel units in the OLED display panel, in addition to perform an internal compensation by setting a pixel compensation circuit in the sub-pixel units, an external compensation can also be performed by setting a sense transistor. FIG. 1A shows a schematic diagram of an externally compensated pixel circuit. As shown in FIG. 1A, the pixel circuit includes a switching transistor T1, a drive transistor T3, a storage capacitor Cst, a sense transistor T2, and an organic electroluminescent (EL) element (i.e., an organic light-emitting diode). For example, the sense transistor T2 may realize a compensation function. For example, a gate electrode of the switching transistor T1 is connected to a scan line to receive a scan signal G1; and for example, a source electrode of the switching transistor T1 is connected to a data line to receive a data signal Vdata; a drain electrode of the switching transistor T1 is connected to a gate electrode of the drive transistor T3; a drain electrode of the drive transistor T3 is connected to a first voltage terminal to receive a first voltage VDD (high voltage), and a source electrode of the drive transistor T3 is connected to a positive terminal of the EL element; one terminal of the storage capacitor Cst is connected to the drain electrode of the switching transistor T1 and the gate electrode of the drive transistor T3, and the other terminal of the storage capacitor Cst is connected to the source electrode of the drive transistor T3. A negative terminal of the EL element is connected to a second voltage terminal to receive a second voltage Vss (a low voltage, for example, a grounded voltage). For example, in a case where the scan signal G1 is applied through the scan line to turn on the switching transistor T1, the data signal Vdata input, through the data line, by a data drive circuit can charge the storage capacitor Cst through the switching transistor T1, so that the data signal Vdata can be stored in the storage capacitor Cst, and the data signal Vdata, which is stored, can control the conduction degree of the drive transistor T3, thereby controlling the current flowing through the drive transistor T3 to drive the EL element to emit light, i.e., the current determines the gray scale of the pixel to emit light.

As shown in FIG. 1A, a first terminal of the sense transistor T2 is connected to a source electrode of the drive transistor T3, a second terminal of the sense transistor T2 is connected to a detection circuit (e.g., including a resistor Rvc, a capacitor Cvc, and devices such as an analog-to-digital conversion (ADC), an amplifier, etc.) via a sense line, and a gate electrode of the sense transistor T2 receives a compensation scan signal G2. Thus, after the compensation scan signal G2 is applied to turn on the drive transistor T3, the detection circuit is charged via the sense transistor S0, so that a potential of the source electrode of the drive transistor T3 changes. In a case where a voltage Vs of the source electrode of the drive transistor T3 is equal to the difference between the voltage Vg of the gate electrode of the drive transistor T3 and a threshold voltage Vth of the drive transistor T3, the drive transistor T3 is turned off. At this time, after the drive transistor T3 is turned off, a sense voltage (that is, a voltage Vb of the source electrode of the drive transistor T3 after the drive transistor T3 is turned off) can be acquired from the source electrode of the drive transistor T3 via the sense transistor T2 which is turned on. After obtaining the voltage Vb of the source electrode of the drive transistor T3 after the drive transistor T3 is turned off, the threshold voltage Vth, which is equal to Vdata-Vb, of the drive transistor can be obtained, so that compensation data can be established (i.e., determined) for each pixel circuit based on the threshold voltage of the drive transistor in each pixel circuit, thereby realizing the threshold voltage compensation function of each sub-pixel of the display panel.

In a case of performing external compensation, a gate drive circuit including shift register units needs to provide a scan signal G1 and a compensation scan signal G2 to the switching transistor T1 and the sense transistor T2, respectively. For example, the scan signal G1 for controlling the switching transistor to be turned on is provided in a display phase of one frame, and the compensation scan signal G2 for controlling the sense transistor to be turned on is provided in a blank phase of one frame.

Figure 1B:
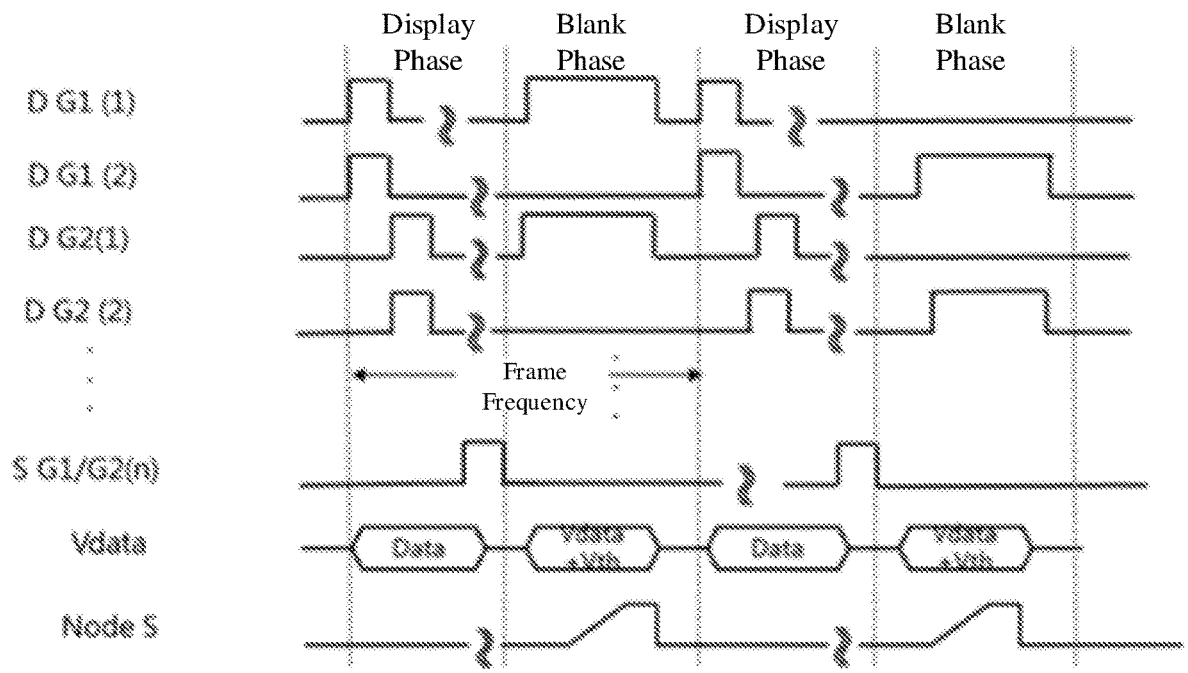
FIG. 1B is a signal timing diagram in a case where a pixel circuit is in operation.

FIG. 1B shows a signal timing chart in a case where the pixel circuit is in operation. The scan signal G1 is a pulse signal provided in the display phase; and the compensation scan signal G2 is a pulse signal provided in the blank phase. As shown in FIG. 1B, a pulse width of the scan signal G1 required in the display phase is different from a pulse width of the compensation scan signal G2 required in the blank phase, which requires the shift register unit to have a pulse width adjustable function, and at the same time, it is also required to ensure that a pulse period of the compensation scan signal required in the blank phase and a pulse period of the scan signal required in the display phase are different and do not interfere with each other.

For OLED display panels, a shift register unit of a gate drive circuit includes a sense unit, a scan unit, and a connection unit (or a gate circuit or a HIZ circuit) that outputs a composite pulse of both the sense unit and the scan unit. With a circuit structure including the above three parts, the shift register unit can output an output pulse of a composite waveform including two waveforms with different widths and timings, thereby providing the scan signal G1 and the compensation scan signal G2 for the switching transistor and the sense transistor respectively. However, the circuit structure of the shift register unit is complex, and two output drive transistors with larger sizes will be needed inevitably to increase the load capacity, which is not conducive to realizing the design of high resolution and narrow frame of the display panel.

Some embodiments of the present disclosure provide a shift register unit including a first sub-shift register, a second sub-shift register, and an output control circuit. The first sub-shift register comprises a first output terminal and a first control node for controlling the first output terminal, and is configured to output a first clock signal under control of a level of the first control node. The second sub-shift register comprises a second output terminal and a second control node for controlling the second output terminal, and is configured so that the second output terminal outputs a display output signal in a display phase and outputs a random output signal in a blank phase under control of a level of the second control node. The output control circuit is connected to the first sub-shift register and the second control node, and is configured to control the level of the second control node under control of an output control signal.

Some embodiments of the present disclosure also provide a gate drive circuit, a display device, and a driving method corresponding to the shift register unit.

According to the shift register unit, the gate drive circuit, the display device and the driving method provided by the above embodiments of the present disclosure, an output signal of the display phase and an output signal of the blank phase can be output through a same output circuit, so that only one output drive transistor with a larger size needs to be provided to drive loads connected with a gate line, thereby being beneficial to simplifying the structure of the shift register unit and the structure of the gate drive circuit, and realizing the design of high resolution and narrow frame of the display panel.

Embodiments of the present disclosure and examples thereof will be described in detail below with reference to the accompanying drawings.

Figure 2:
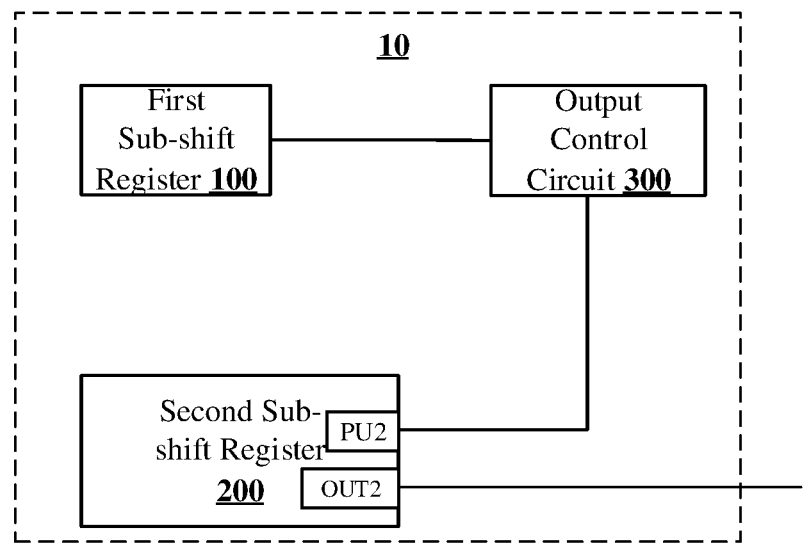
FIG. 2 is a schematic diagram of a shift register unit provided by some embodiments of the present disclosure.

FIG. 2 is a schematic diagram of a shift register unit provided by some embodiments of the disclosure. As shown in FIG. 2, the shift register unit 10 includes a first sub-shift register 100, a second sub-shift register 200, and an output control circuit 300. The shift register unit 10 can be cascaded to form a gate drive circuit for driving, for example, an OLED display panel.

For example, the first sub-shift register 100 includes a first output terminal (not shown) and a first control node (not shown) for controlling the first output terminal, and is configured to output a first clock signal under control of the level of the first control node.

For example, in some embodiments of the present disclosure, the shift register unit further includes a second control node, a third control node, and a fourth control node. A first pull-up node is an example of the first control node, a second pull-up node is an example of the second control node, a first pull-down node is an example of the third control node, and a second pull-down node is an example of the fourth control node. Hereinafter, a case that the first control node is the first pull-up node, the second control node is the second pull-up node, the third control node is the first pull-down node, and the fourth control node is the second pull-down node, is taken as an example to be described. However, the embodiments of the present disclosure are not limited to such a case, and this case may also apply to the following embodiments and will not be described again.

For example, the second sub-shift register 200 includes a second output terminal OUT2 and the second pull-up node PU2 for controlling the second output terminal OUT2, and is configured so that the second output terminal OUT2 outputs a display output signal in a display phase and a random output signal in a blank phase (also called a blanking phase) under control of a level of the second pull-up node PU2. For example, the random output signal may be used for external compensation, for example, for driving the sense transistor T2 as shown in FIG. 1A.

For example, the output control circuit 300 is connected to the first sub-shift register 100 and the second pull-up node PU2 of the second sub-shift register 200, and is configured to control the level of the second pull-up node PU2 under control of an output control signal, so that the second output terminal OUT2 outputs a display output signal in the display phase and outputs a random output signal in the blank stage. In this way, the gate drive circuit cascaded by the shift register units 10 outputs a display output signal in the display phase and a random output signal in the blank phase, which are output only through the second output terminal of the second sub-shift register 200 of the shift register unit 10. For example, the second output terminal OUT2 is connected to a previous stage of shift register unit and a next stage of shift register unit, which are cascaded with the second output terminal OUT2, to provide a shift output signal, and is also connected to other loads (e.g., pixel circuits), through the gate line, in the display panel for driving the operation of the display panel. Therefore, only a output drive transistor (e.g., a transistor is an output transistor, which controls the second output terminal) with a larger size is required to drive the load connected to the gate line which is connected with the output drive transistor, thereby being beneficial to simplifying the structure of the shift register unit and the structure of the gate drive circuit, and realizing the design of high resolution and narrow frame of the display panel.

For example, the output control signal for the output control circuit 300 may include a level of the first pull-up node of the first sub-shift register 100 and the first clock signal, or may include the first clock signal output from the first output terminal. For example, in a case where the output control signal includes the level of the first pull-up node of the first sub-shift register 100 and the first clock signal, the output control circuit 300 may be connected to the first pull-up node of the first sub-shift register 100 and a first clock signal terminal (not shown in the figure) providing the first clock signal. For example, in a case where the output control signal includes the first clock signal output from the first output terminal, the output control circuit 300 may be connected to the first output terminal of the first sub-shift register 100.

Figure 3:
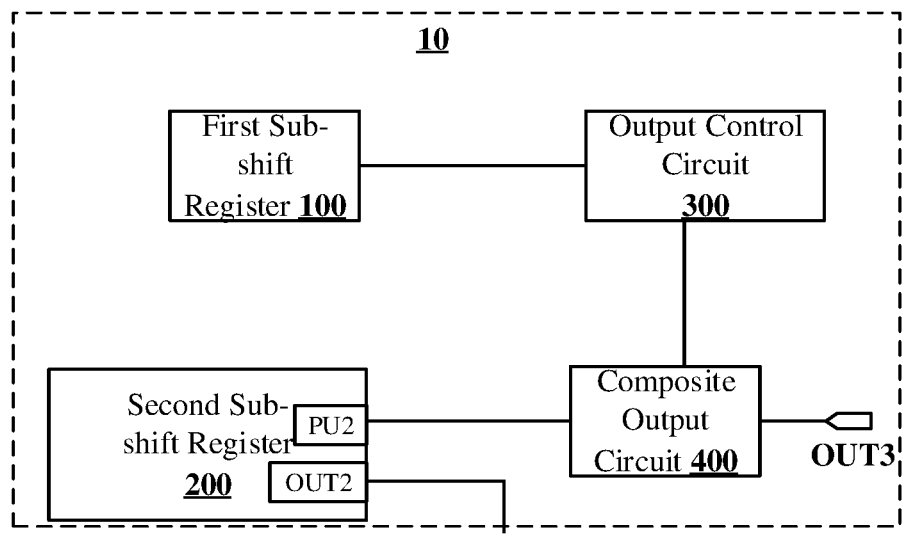
FIG. 3 is a schematic diagram of another shift register unit provided by some embodiments of the disclosure.

FIG. 3 is a schematic diagram of another shift register unit provided by some embodiments of the disclosure. As shown in FIG. 3, compared with the shift register unit as shown in FIG. 2, the shift register unit 10 further includes a composite output circuit 400 and a third output terminal OUT3.

The composite output circuit 400 is connected to the output control circuit 300, the second pull-up node PU2, and the third output terminal OUT3, and is configured so that the third output terminal OUT3 outputs the display output signal in the display phase and outputs the random output signal in the blank phase under control of the level of the second pull-up node PU2. A signal output from the third output terminal OUT is identical to a signal output from the second output terminal OUT2. For example, the second output terminal OUT2 is connected to a previous stage of second sub-shift register 200 and a next stage of second sub-shift register 200, which are cascaded with the second output terminal OUT2, to provide a shift signal, while the third output terminal OUT3 is connected to a load (e.g., a pixel circuit) through a gate line, so that crosstalk of the data signal transmitted by the data line to the shift signal output from the second output terminal OUT2 can be avoided, thereby ensuring the reliability of the output signal of the plurality of cascaded shift register units. Correspondingly, in the embodiments, it is only necessary to provide an output drive transistor with a larger size to increase the load capacity, that is, an output transistor controlling the output of the third output terminal OUT3 in the composite output circuit 400 connected to the gate line. Because the second output terminal is used for outputting the shift signals of the shift register units cascaded with the second output terminal, the load connected with the second output terminal does not need to be driven through a gate line, therefore, the output transistor of the second output terminal does not need a larger size, thereby being beneficial to realizing the design of narrow frame of the display panel.

Figure 4A:
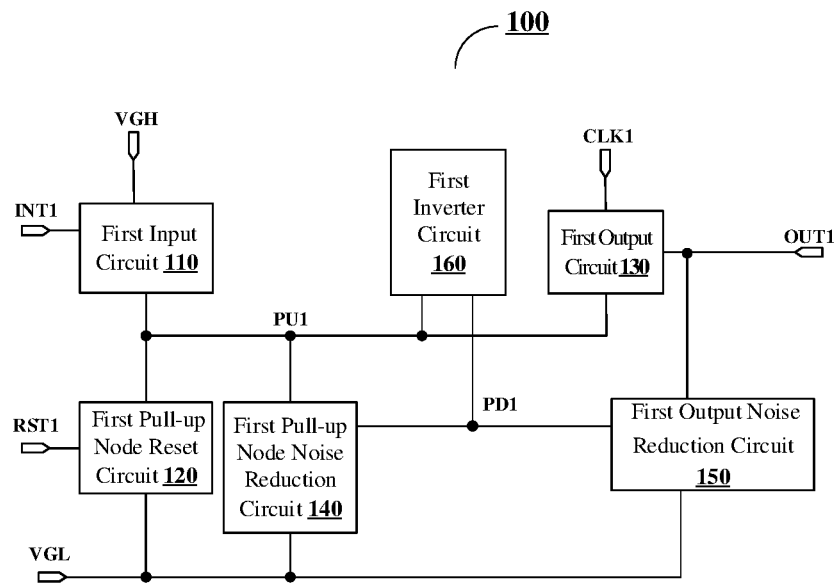
FIG. 4A is a schematic diagram of a first sub-shift register provided by some embodiments of the disclosure.

The embodiments of the present disclosure are not limited to the specific structure of the first sub-shift register, and may adopt a known circuit structure capable of realizing the shift register unit, for example, including an input circuit, a first pull-up node, and an output circuit, the input circuit controls the level of the first pull-up node, and the first pull-up node controls the output circuit to output a pulse signal. FIG. 4A is a schematic diagram of an example of the first sub-shift register 100 as shown in FIG. 2 or FIG. 3.

As shown in FIG. 4A, in an example, the first sub-shift register 100 may include a first input circuit 110, a first control node reset circuit 120, a first output circuit 130, a first control node noise reduction circuit 140, a first output noise reduction circuit 150, and a first inverter circuit 160. For example, in some embodiments of the present disclosure, a first pull-up node reset circuit is an example of the first control node reset circuit 120, a first pull-up node noise reduction circuit is an example of the first control node noise reduction circuit 140. In the following, a case that the first control node reset circuit 120 is the first pull-up node reset circuit and the first control node noise reduction circuit 140 is the first pull-up node noise reduction circuit, is taken as an example to be described, but embodiments of the present disclosure are not limited to this case, and this case may also apply to the following embodiments and will not be described again.

The first input circuit 110 is configured to charge the first pull-up node PU1 in response to a first input signal. For example, the first input circuit 110 is connected to a first input terminal INT1, a second voltage terminal VGH and the first pull-up node PU1, and is configured to electrically connect the first pull-up node PU1 and the second voltage terminal VGH under control of a signal input from the first input terminal INT1, so that a second voltage (e.g., a high-level signal) input from the second voltage terminal can control (e.g., charge) a potential of the first pull-up node PU1 to increase the voltage of the first pull-up node PU1 to control the first output circuit 130 to be turned on. It should be noted that the first input circuit 110 is not limited to this case, but may also be connected to the first input terminal INT1 and the first pull-up node PU1, and is configured to electrically connect the first pull-up node PU1 and the first input terminal INT1 under control of the signal input from the first input terminal INT1, so that a high-level signal input from the first input terminal INT1 can charge the first pull-up node PU1.

The first pull-up node reset circuit 120 is configured to reset the first pull-up node PU1 in response to a first reset signal. For example, the first pull-up node reset circuit 120 may be configured to be connected to a first reset terminal RST1, a first voltage terminal VGL, and the first pull-up node PU1, so that the first pull-up node PU1 may be electrically connected to a pull-down voltage terminal (e.g., a low-level signal or a low-voltage terminal), for example, the first voltage terminal VGL, under control of a reset signal input from the first reset terminal RST1, so as to reset the first pull-up node PU1 by pulling down (e.g., discharging).

The first output circuit 130 is configured to output the first clock signal, as the output signal of the first sub-shift register 100, input from the first clock signal terminal CLK1 to the first output terminal OUT1 under control of the level of the first pull-up node PU1 For example, the first output circuit 130 is connected to the first pull-up node PU1, the first clock signal terminal CLK1, and the first output terminal OUT1, and is configured to be turned on under control of the level of the first pull-up node PU1 to electrically connect the first clock signal terminal CLK1 and the first output terminal OUT1, so that the clock signal input by the first clock signal terminal CLK1 can be output to the first output terminal OUT1.

The first pull-up node noise reduction circuit 140 is configured to perform noise reduction on the first pull-up node PU1 under control of a level of the first pull-down node PD1. For example, the first pull-up node noise reduction circuit 140 is connected to the first pull-up node PU1, the first pull-down node PD1, and the first voltage terminal VGL, and electrically connects the first pull-up node PU1 and the first voltage terminal VGL under the control of the level of the first pull-down node PD1, thereby performing pull-down and noise reduction on the first pull-up node PU1.

The first output noise reduction circuit 150 is configured to perform noise reduction on the first output terminal OUT1 under control of the level of the first pull-down node PD1. For example, the first output noise reduction circuit 150 is connected to the first pull-down node PD1, the first output terminal OUT1, and the first voltage terminal VGL, and is configured to electrically connect the first output terminal OUT1 and the first voltage terminal VGL under the control of the level of the first pull-down node PD1, thereby performing pull-down and noise reduction on the first output terminal OUT1.

The first inverter circuit 160 is configured to control the level of the first pull-down node PD1 under the control of the level of the first pull-up node PU1. For example, the first inverter circuit 160 is connected to the first pull-up node PU1 and the first pull-down node PD1, and is configured to pull down the first pull-down node PD1 to a low level in a case where the first pull-up node PU1 is at a high level, and pull up the first pull-down node PD1 to a high level in a case where the first pull-up node PU1 is at a low level. For example, the first inverter circuit 160 may be an inverting circuit or any other circuit that can realize the inverting function.

Figure 4B:
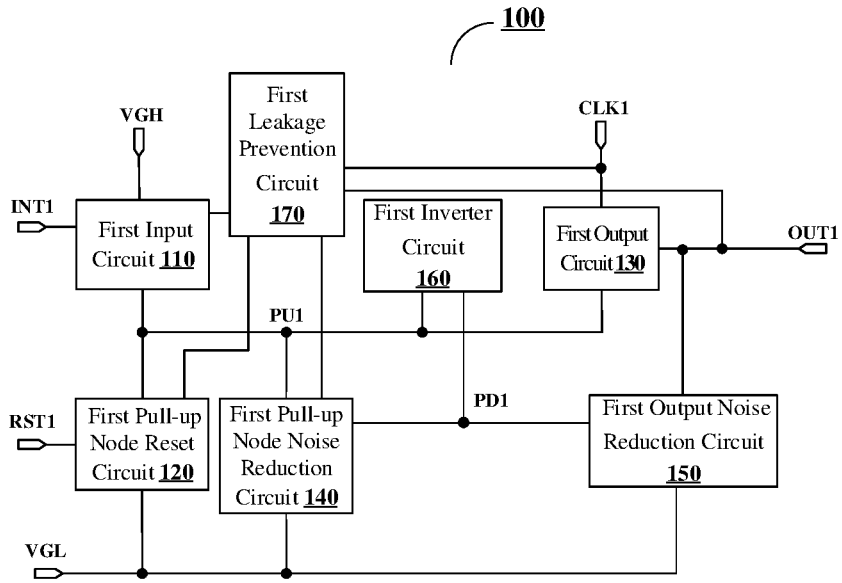
FIG. 4B is a schematic diagram of another first sub-shift register provided by some embodiments of the disclosure.
Figure 4C:
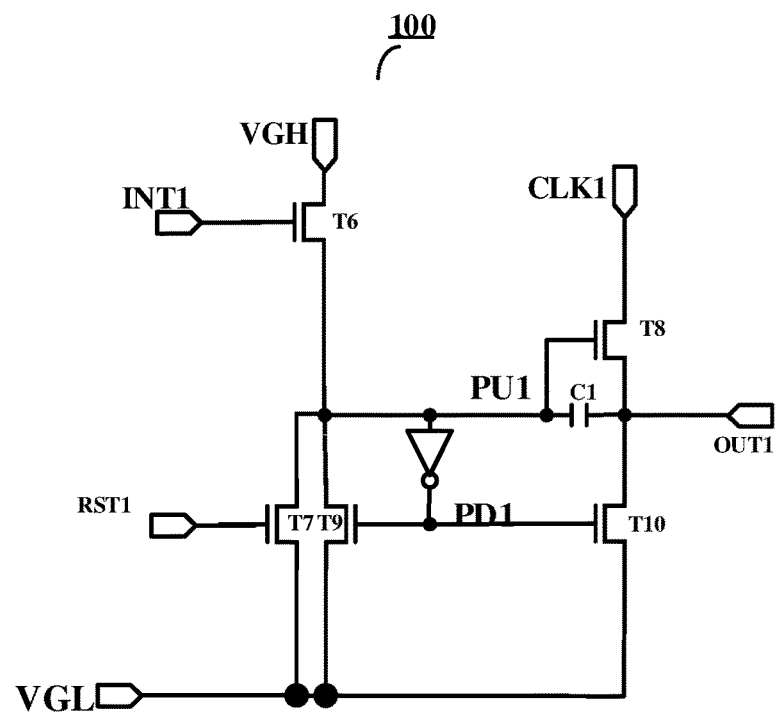
FIG. 4C is a circuit schematic diagram of a specific implementation example of the first sub-shift register as shown in FIG. 4A.

For example, the first sub-shift register 100 as shown in FIG. 4A may be implemented as the circuit structure as shown in FIG. 4C in an example. The following description is illustrated by taking a case that each transistor is an N-type transistor as an example, but it is not a limitation to the embodiment of the present disclosure. For example, the N-type transistor is turned on in response to a high-level signal and turned off in response to a low-level signal. The above case also applies to the following embodiments and will not be described again.

The first input circuit 110 may be implemented as a sixth transistor T6. A gate electrode of the sixth transistor T6 is electrically connected to the first input terminal INT1 to receive the input signal, a first electrode of the sixth transistor T6 is electrically connected to the second voltage terminal VGH to receive a second voltage, and a second electrode of the sixth transistor T6 is configured to be connected to the first pull-up node PU1 so as to electrically connect the first pull-up node PU1 and the second voltage terminal VGH to charge the first pull-up node PU1 to a high level in a case where the sixth transistor T6 is turned on due to a turn-on signal (high-level signal) received by the first input terminal INT1.

The first pull-up node reset circuit 120 may be implemented as a seventh transistor T7. A gate electrode of the seventh transistor T7 is configured to be connected to the first reset terminal RST1 to receive the first reset signal, a first electrode of the seventh transistor T7 is configured to be connected to the first pull-up node PU1, and a second electrode of the seventh transistor T7 is configured to be connected to the first voltage terminal VGL to receive a first voltage. In a case where the seventh transistor T7 is turned on due to the first reset signal, the first pull-up node PU1 is electrically connected to the first voltage terminal VGL, so that the first pull-up node PU1 can be reset and pulled down from a high level to a low level.

The first output circuit 130 may be implemented to include an eighth transistor T8 and a first storage capacitor C1. A gate electrode of the eighth transistor T8 is configured to be connected to the first pull-up node PU1, a first electrode of the eighth transistor T8 is configured to be connected to the first clock signal terminal CLK1 to receive the first clock signal, and a second electrode of the eighth transistor T8 is configured to be connected to the first output terminal OUT1; and a first electrode of the first storage capacitor C1 is configured to be connected to the gate electrode of the eighth transistor T8, and a second electrode of the first storage capacitor C1 is connected to the second electrode of the eighth transistor T8.

The first pull-up node noise reduction circuit 140 may be implemented as a ninth transistor T9. A gate electrode of the ninth transistor T9 is configured to be connected to the first pull-down node PD1, a first electrode of the ninth transistor T9 is configured to be connected to the first pull-up node PU1, and a second electrode of the ninth transistor T9 is configured to be connected to the first voltage terminal VGL to receive the first voltage. The ninth transistor T9 is turned on because the first pull-down node PD1 is at a high potential, and connects the first pull-up node PU1 and the first voltage terminal VGL, so that the first pull-up node PU1 can be pulled down to realize noise reduction.

The first output noise reduction circuit 150 may be implemented as a tenth transistor T10. A gate electrode of the tenth transistor T10 is configured to be connected to the first pull-down node PD1, a first electrode of the tenth transistor T10 is configured to be connected to the first output terminal OUT1, and a second electrode of the tenth transistor T10 is configured to be connected to the first voltage terminal VGL to receive the first voltage. The tenth transistor T10 is turned on because the first pull-down node PD1 is at a high potential, and connects the first output terminal OUT1 and the first voltage terminal VGL, thereby performing noise reduction to the first output terminal OUT1.

In a case where the potential of the first pull-up node PU1 is maintained at a high level, first electrodes of some transistors (e.g., the sixth transistor T6 (in a case where the gate electrode of the sixth transistor T6 and the first electrode of the sixth transistor T6 are both connected to the first input terminal INT1), the seventh transistor T7, and the ninth transistor T9) are connected to the first pull-up node PU1, while second electrodes of the some transistors are connected to a low-level signal. Even in a case where a non-conductive signal is input to gate electrodes of these transistors, leakage current may occur due to a voltage difference between the first electrodes and the second electrodes, thereby deteriorating the effect of maintaining the potential of the first pull-up node PU1 in the shift register unit 10.

In view of the above problems, as shown in FIG. 4B, a shift register unit 10 for preventing leakage is provided in an embodiment of the present disclosure. As shown in FIG. 4B, in another example, compared with the example as shown in FIG. 4A, the first sub-shift register 100 may further include a first leakage protection circuit 170. It should be noted that the same problem also exists in the second sub-shift register 200 and will not be repeated herein again.

For example, the first leakage protection circuit 170 is configured to maintain the high potential of the first pull-up node PU1 under the control of the first clock signal, as the output signal, output from the first output terminal OUT1. For example, the first leakage protection circuit 170 is connected to the first clock signal terminal CLK1, the first output terminal OUT1, the first pull-up node reset circuit 120, the first pull-up node noise reduction circuit 140, and the first input circuit 110, and is configured to cause a source electrode and a drain electrode of each transistor connected to the first pull-up node PU1 to be at high levels simultaneously under control of a high level of the first clock signal output from the first output terminal OUT1, thereby preventing the level of the first pull-up node PU1 from being lowered due to leakage to affect the display quality.

It should be noted that those skilled in the art can understand that according to the embodiment of the circuit with leakage protection function provided by the embodiment of the present disclosure, one or more transistors in the first sub-shift register 100 can be selected according to the actual situation to add an leakage protection circuit structure. FIG. 4B shows only an exemplary circuit structure including a leakage protection circuit and does not constitute a limitation to the embodiment of the present disclosure.

Figure 4D:
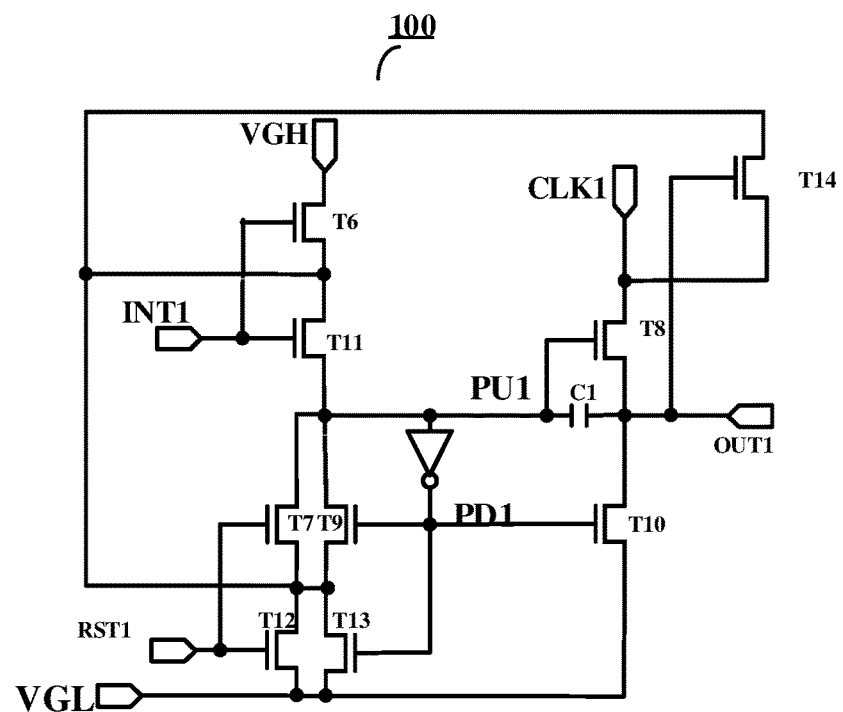
FIG. 4D is a circuit schematic diagram of a specific implementation example of the first sub-shift register as shown in FIG. 4B.

For example, the first sub-shift register 100 as shown in FIG. 4B may be implemented as the circuit structure as shown in FIG. 4D in an example. The structure of the first sub-shift register 100 is similar to the structure of the first sub-shift register 100 in FIG. 4C, except that transistors implementing the first leakage protection circuit 170 are added.

For example, the first leakage protection circuit 170 may be implemented as an eleventh transistor T11, a twelfth transistor T12, a thirteenth transistor T13, and a fourteenth transistor T14. A gate electrode of the eleventh transistor T11 is connected to the first input terminal INT1 to receive the first input signal, a first electrode of the eleventh transistor T11 is connected to a second electrode of the fourteenth transistor T14 and the second electrode of the sixth transistor T6, and a second electrode of the eleventh transistor T11 is connected to the first pull-up node PU1; and a gate electrode of the twelfth transistor T12 is connected to the first reset terminal RST1 to receive the first reset signal, a first electrode of the twelfth transistor T12 is connected to the second electrode of the fourteenth transistor T14 and the second electrode of the seventh transistor T7, and a second electrode of the twelfth transistor T12 is connected to the first voltage terminal VGL to receive the first voltage; a gate electrode of the thirteenth transistor T13 is connected to the first pull-down node PD1, a first electrode of the thirteenth transistor T13 is connected to the second electrode of the fourteenth transistor T14 and the second electrode of the ninth transistor T9, and a second electrode of the thirteenth transistor T13 is connected to the first voltage terminal VGL to receive the first voltage; and a gate electrode of the fourteenth transistor T14 is connected to the first output terminal OUT1, and a first electrode of the fourteenth transistor T14 is connected to the first clock signal terminal CLK1 to receive the first clock signal. In a case where the first clock signal provided by the first clock signal terminal CLK1 is in a high level state and the first pull-up node PU1 is also in a high level state, the first output terminal OUT1 outputs the first clock signal under the control of the first pull-up node PU1. At this time, the fourteenth transistor T14 is turned on under the control of the high level of the first clock signal, as the output signal output from the first output terminal OUT1, so that the first clock signal terminal CLK1 can be connected to the second electrode of the eleventh transistor T11, the second electrode of the twelfth transistor T12, the second electrode of the thirteenth transistor T13, the second electrode of the sixth transistor T6, the second electrode of the seventh transistor T7, and the second electrode of the ninth transistor T9. Thus, the first electrode and the second electrode of the sixth transistor T6, the first electrode and the second electrode of the seventh transistor T7 and the first electrode and the second electrode of the ninth transistor T9 are all in a high level state, for example, the first electrode is at a high level of the first pull-up node PU1 and the second electrode is at a high level of the first clock signal, thus preventing the electric charge of the first pull-up node PU1 from leaking through the sixth transistor T6, the seventh transistor T7 and the ninth transistor T9 connected thereto.

It should be noted that the structure as shown in FIGS. 4A and 4B is not limited to this case, and the first shift register unit may also be other various types of shift register units, and the embodiments of the present disclosure are not limited to this case.

It should be noted that the first voltage terminal VGL may be configured to continue to input a DC low-level signal, for example, the DC low-level signal may be referred to as the first voltage, and the second voltage terminal VGH may be configured to continue to input a DC high-level signal, for example, the DC high-level signal may be referred to as the second voltage, and the first voltage is lower than the second voltage. The above case also applies to the following embodiments and will not be described again.

Figure 5A:
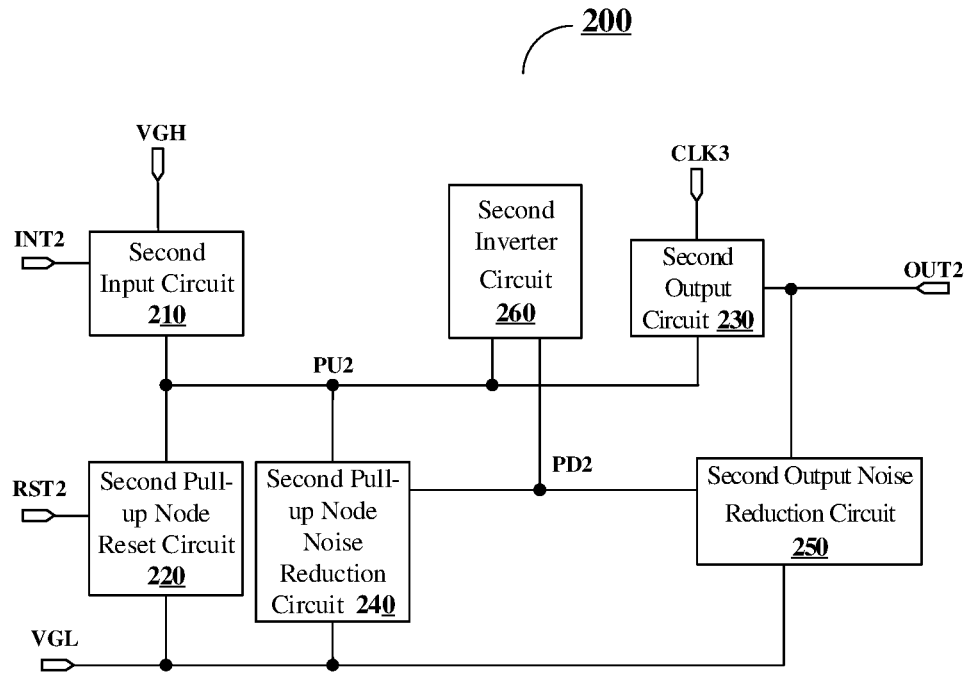
FIG. 5A is a schematic diagram of a second sub-shift register provided by some embodiments of the disclosure.

Similarly, the embodiments of the present disclosure are not limited to the specific configuration of the second sub-shift register, and may adopt a known circuit structure capable of realizing the shift register unit, including, for example, an input circuit, a second pull-up node, and an output circuit, the input circuit controls the level of the second pull-up node, and the second pull-up node controls the output circuit to output a pulse signal. For example, the first sub-shift register and the second sub-shift register may have the same configuration, thereby simplifying the design and manufacturing process of the shift register unit of the embodiment of the present disclosure. FIG. 5A is a schematic diagram of an example of the second sub-shift register 200 as shown in FIG. 2 or FIG. 3.

As shown in FIG. 5A, in an example, the second sub-shift register 200 may include a second input circuit 210, a second control node reset circuit (not shown in the figure), a second output circuit 230, a second control node noise reduction circuit (not shown in the figure), a second output noise reduction circuit 250, and a second inverter circuit 260. For example, in some embodiments of the present disclosure, a second pull-up node reset circuit 220 is an example of the second control node reset circuit, a second pull-up node noise reduction circuit 240 is an example of the second control node noise reduction circuit, and the following will be described by taking a case that the second control node reset circuit is the second pull-up node reset circuit 220, and the second control node noise reduction circuit is the second pull-up node noise reduction circuit 240 as an example, but the embodiments of the present disclosure are not limited to this case, and this case may also apply to the following embodiments and will not be described again.

The second input circuit 210 is configured to charge the second pull-up node PU2 in response to a second input signal. For example, the second input circuit 210 is connected to a second input terminal INT2, the second voltage terminal VGH, and the second pull-up node PU2, and is configured to electrically connect the second pull-up node PU2 and the second voltage terminal VGH under control of a signal input from the second input terminal INT2, so that the second voltage (e.g., a high-level signal) input from the second voltage terminal VGH can charge the second pull-up node PU2 to increase the voltage of the second pull-up node PU2 to control the second output circuit 230 to be turned on. It should be noted that the second input circuit 210 is not limited to this case, and may be only connected to the second input terminal INT2 and the second pull-up node PU2, and is configured to electrically connect the second pull-up node PU2 and the second input terminal INT2 under the control of the signal input from the second input terminal INT2, so that the high-level signal input from the second input terminal INT2 can charge the second pull-up node PU2.

The second pull-up node reset circuit 220 is configured to reset the second pull-up node PU2 in response to a second reset signal. For example, the second pull-up node reset circuit 220 may be configured to be connected to the second reset terminal RST2, the first voltage terminal VGL, and the second pull-up node PU2, so that the second pull-up node PU2 may be electrically connected to a low-level signal or a low-voltage terminal, such as the first voltage terminal VGL, under the control of a reset signal input from the second reset terminal RST2, thereby performing pull-down reset of the second pull-up node PU2.

The second output circuit 230 is configured to output a third clock signal, as the output signal of the second sub-shift register 200, input from a third clock signal terminal CLK3 to the second output terminal OUT2 under the control of the level of the second pull-up node PU2. For example, the second output circuit 230 is connected to the second pull-up node PU2, the third clock signal terminal CLK3 and the second output terminal OUT2, and is configured to be turned on under the control of the level of the second pull-up node PU2 to electrically connect the third clock signal terminal CLK3 and the second output terminal OUT2, so that the clock signal input by the third clock signal terminal CLK3 can be output to the second output terminal OUT2. For example, the third clock signal includes a display output signal and a random output signal having different pulse widths and timings. For example, the combination of the two different signals into the third clock signal can be realized by a Field-Programmable Gate Array (FPGA), and third clock signal, which is combined, is output through the second output terminal OUT2, so that the display output signal and the random output signal can be output only through the second output terminal OUT2.

The second pull-up node noise reduction circuit 240 is configured to perform noise reduction on the second pull-up node PU2 under the control of the level of the second pull-down node PD2. For example, the second pull-up node noise reduction circuit 240 is connected to the second pull-up node PU2, the second pull-down node PD2, and the first voltage terminal VGL, and electrically connects the second pull-up node PU2 and the first voltage terminal VGL under the control of the level of the second pull-down node PD2, thereby performing pull-down and noise reduction on the second pull-up node PU2.

The second output noise reduction circuit 250 is configured to perform noise reduction on the second output terminal OUT2 under the control of the level of the second pull-down node PD2. For example, the second output noise reduction circuit 250 is connected to the second pull-down node PD2, the second output terminal OUT2, and the first voltage terminal VGL, and is configured to electrically connect the second output terminal OUT2 and the first voltage terminal VGL under the control of the level of the second pull-down node PD2, thereby performing pull-down and noise reduction on the second output terminal OUT2.

The second inverter circuit 260 is configured to control the level of the second pull-up node PD2 under the control of the level of the second pull-up node PU2. For example, the second inverter circuit 260 is connected to the second pull-up node PU2 and the second pull-down node PD2, and is configured to pull down the second pull-down node PD2 to a low level in a case where the second pull-up node PU2 is at a high level, and pull up the second pull-down node PD2 to a high level in a case where the second pull-up node PU2 is at a low level. For example, the second inverter circuit 260 may be an inverting circuit or any other circuit that can realize the inverting function.

Figure 5B:
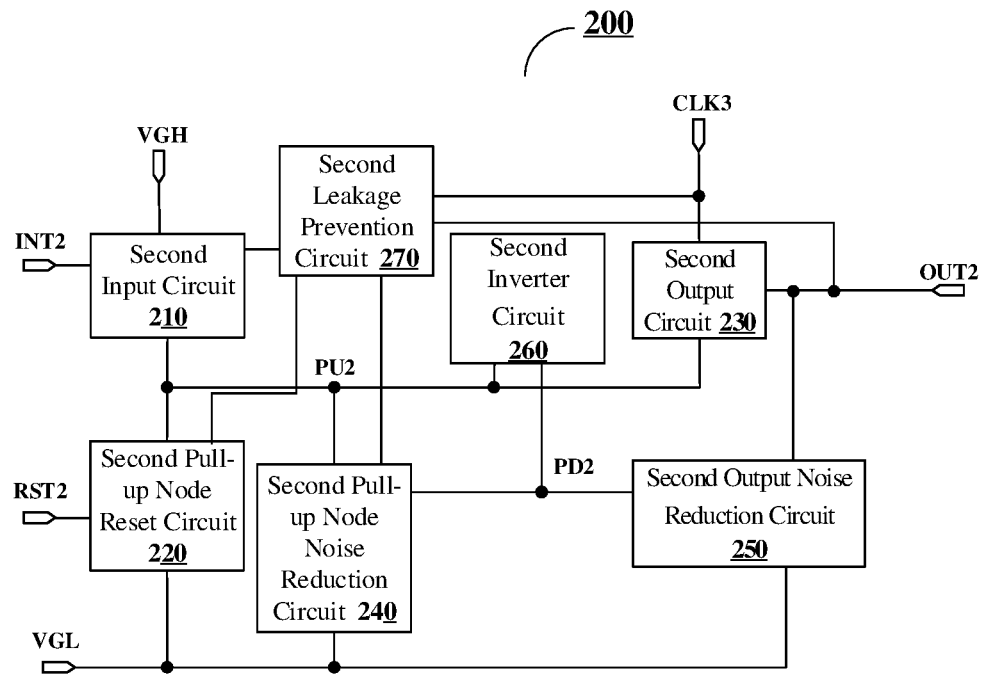
FIG. 5B is a schematic diagram of another second sub-shift register provided by some embodiments of the disclosure.
Figure 5C:
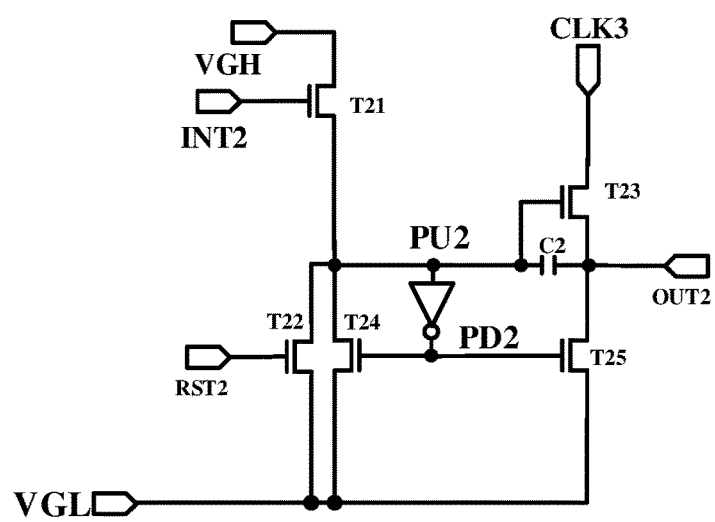
FIG. 5C is a circuit schematic diagram of a specific implementation example of the second sub-shift register as shown in FIG. 5A.

For example, the second sub-shift register 200 as shown in FIG. 5A may be implemented as the circuit structure as shown in FIG. 5C in an example. The following description is illustrated by taking a case that each transistor is an N-type transistor, but the embodiment of the present disclosure are not limited to this case.

The second input circuit 210 may be implemented as a twenty-first transistor T21. A gate electrode of the twenty-first transistor T21 is electrically connected to the second input terminal INT2 to receive the input signal, a first electrode of the twenty-first transistor T21 is electrically connected to the second voltage terminal VGH to receive the second voltage, and a second electrode of the twenty-first transistor T21 is configured to be connected to the second pull-up node PU2 so as to electrically connect the second pull-up node PU2 and the second voltage terminal VGH to charge the second pull-up node PU2 to a high level in a case where the twenty-first transistor T21 is turned on due to a turn-on signal (high-level signal) received by the second input terminal INT2.

The second pull-up node reset circuit 220 may be implemented as a twenty-second transistor T22. A gate electrode of the twenty-second transistor T22 is configured to be connected to the second reset terminal RST2 to receive a second reset signal, a first electrode of the twenty-second transistor T22 is configured to be connected to the second pull-up node PU2, and a second electrode of the twenty-second transistor T22 is configured to be connected to the first voltage terminal VGL to receive the first voltage. In a case where the twenty-second transistor T22 is turned on due to the second reset signal, the second pull-up node PU2 is electrically connected to the first voltage terminal VGL, so that the second pull-up node PU2 can be reset and lowered from the high level to the low level.

The second output circuit 230 may be implemented to include a twenty-third transistor T23 and a second storage capacitor C2. A gate electrode of the twenty-third transistor T23 is configured to be connected to the second pull-up node PU2, a first electrode of the twenty-third transistor T23 is configured to be connected to the third clock signal terminal CLK3 to receive the third clock signal, and a second electrode of the twenty-third transistor T23 is configured to be connected to the second output terminal OUT2; and a first electrode of the second storage capacitor C2 is configured to be connected to the gate electrode of the twenty-third transistor T23, and a second electrode of the second storage capacitor C2 is connected to the second electrode of the twenty-third transistor T23. For example, in a case where the composite output circuit is not included, the twenty-third transistor T23, as an output drive transistor, has a larger size and can be connected to a gate line to drive a load, such as a pixel circuit and the like, connected to the gate line. In a case where the composite output circuit is included, the composite output circuit serves as an output drive transistor with a larger size, and the twenty-third transistor T23 serves as a transistor for outputting a shift signal, and does not need a larger size.

The second pull-up node noise reduction circuit 240 may be implemented as a twenty-fourth transistor T24. A gate electrode of the twenty-fourth transistor T24 is configured to be connected to the second pull-down node PD2, a first electrode of the twenty-fourth transistor T24 is configured to be connected to the second pull-up node PU2, and a second electrode of the twenty-fourth transistor T24 is configured to be connected to the first voltage terminal VGL to receive the first voltage. The twenty-fourth transistor T24 is turned on in a case where the second pull-down node PD2 is at a high potential, and connects the second pull-up node PU2 and the first voltage terminal VGL, so that the second pull-up node PU2 can be pulled down to realize noise reduction.

The second output noise reduction circuit 250 may be implemented as a twenty-fifth transistor T25. A gate electrode of the twenty-fifth transistor T25 is configured to be connected to the second pull-down node PD2, a first electrode of the twenty-fifth transistor T25 is configured to be connected to the second output terminal OUT2, and a second electrode of the twenty-fifth transistor T25 is configured to be connected to the first voltage terminal VGL to receive the first voltage. The twenty-fifth transistor T25 is turned on in a case where the second pull-down node PD2 is at a high potential, connects the second output terminal OUT2 and the first voltage terminal VGL, thereby performing noise reduction on the second output terminal OUT2.

As shown in FIG. 5B, in another example, compared with the example as shown in FIG. 5A, the second sub-shift register 200 may further include a second leakage protection circuit 270.

The second leakage protection circuit 270 is configured to maintain the high potential of the second pull-up node PU2 under control of the second clock signal output from the second output terminal OUT2. For example, the second leakage protection circuit 270 is connected to the third clock signal terminal CLK3, the second output terminal OUT2, the second pull-up node reset circuit 220, the second pull-up node noise reduction circuit 240, and the second input circuit 210, and is configured so that a source electrode and a drain electrode of each transistor connected to the second pull-up node PU2 are at high levels simultaneously under control of the high level of the third clock signal output from the second output terminal OUT2, thereby avoiding the level of the second pull-up node PU2 from being lowered due to leakage to affect the display quality.

Figure 5D:
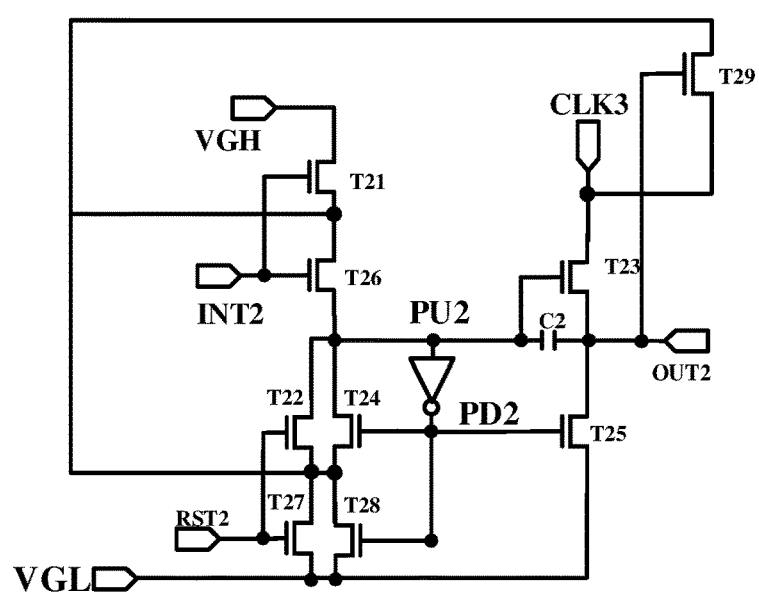
FIG. 5D is a circuit schematic diagram of a specific implementation example of the second sub-shift register as shown in FIG. 5B.

For example, the second sub-shift register 200 as shown in FIG. 5B may be implemented as the circuit structure as shown in FIG. 5D in an example. The second sub-shift register 200 is similar in structure to the second sub-shift register 200 as shown in FIG. 5C, except that a transistor for implementing the second leakage protection circuit 270 is added.

The second leakage protection circuit 270 may be implemented as a twenty-sixth transistor T26, a twenty-seventh transistor T27, a twenty-eighth transistor T28, and a twenty-ninth transistor T29. A gate electrode of the twenty-sixth transistor T26 is connected to the second input terminal INT2 to receive the second input signal, a first electrode of the twenty-sixth transistor T26 is connected to a second electrode of the twenty-ninth transistor T29 and the second electrode of the twenty-first transistor T21, and a second electrode of the twenty-sixth transistor T26 is connected to the second pull-up node PU2; a gate electrode of the twenty-seventh transistor T27 is connected to the second reset terminal RST2 to receive the second reset signal, a first electrode of the twenty-seventh transistor T27 is connected to the second electrode of the twenty-ninth transistor T29 and the second electrode of the twenty-second transistor T22, and a second electrode of the twenty-seventh transistor T27 is connected to the first voltage terminal VGL to receive the first voltage; a gate electrode of the twenty-eighth transistor T28 is connected to the second pull-down node PD2, a first electrode of the twenty-eighth transistor T28 is connected to the second electrode of the twenty-ninth transistor T29 and the second electrode of the twenty-fourth transistor T24, and a second electrode of the twenty-eighth transistor T28 is connected to the first voltage terminal VGL to receive the first voltage; and a gate electrode of the twenty-ninth transistor T29 is connected to the second output terminal OUT2, and a first electrode of the twenty-ninth transistor T29 is connected to the third clock signal terminal CLK3 to receive the third clock signal. The operation principle of the second leakage protection circuit 270 is similar to the operation principle of the first leakage protection circuit 170 as shown in FIG. 4D, and will not be described here again.

It should be noted that those skilled in the art can understand that according to the embodiment of the circuit with leakage protection function provided by the embodiment of the present disclosure, one or more transistors in the second sub-shift register 200 can be selected according to the actual situation to add a leakage protection circuit structure. FIG. 5B shows only one exemplary circuit structure including a leakage protection circuit and does not constitute a limitation to the embodiment of the present disclosure.

It should be noted that, the second shift register unit is not limited to the structure as shown in FIGS. 5A and 5B, may also be other various types of shift register units, and the embodiment of the present disclosure is not limited to this case.

Figure 6:
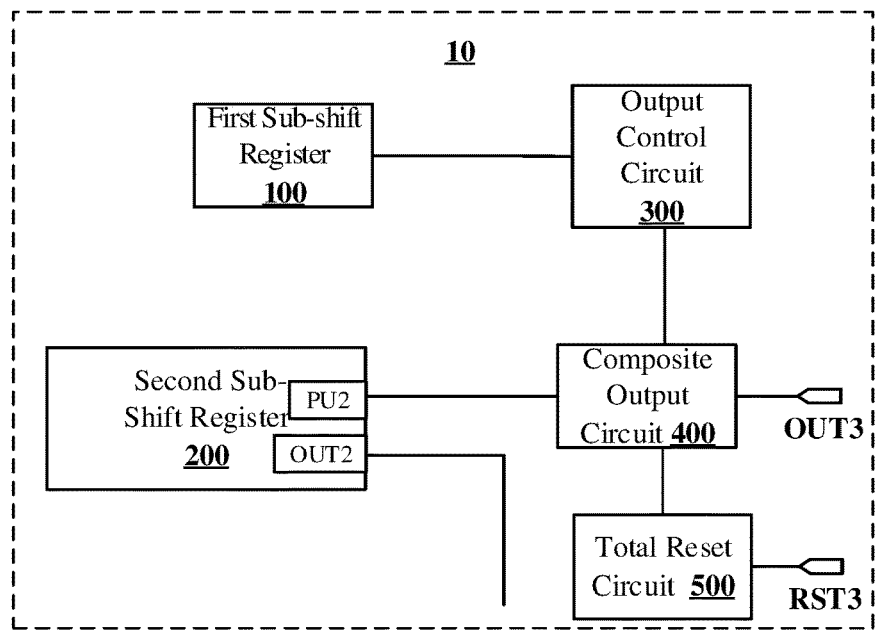
FIG. 6 is a schematic diagram of yet another shift register unit provided by some embodiments of the disclosure.

FIG. 6 is a schematic diagram of another shift register unit provided by some embodiments of the disclosure. As shown in FIG. 6, on the basis of the example as shown in FIG. 3, the shift register unit 10 may further include a total reset circuit 500. For example, the total reset circuit 500 is configured to reset the second pull-up node PU2 under control of a third reset signal, and reset the composite output circuit 400 and the third output terminal OUT3, at the same time, thereby ensuring the contrast of the display panel.

Figure 7A:
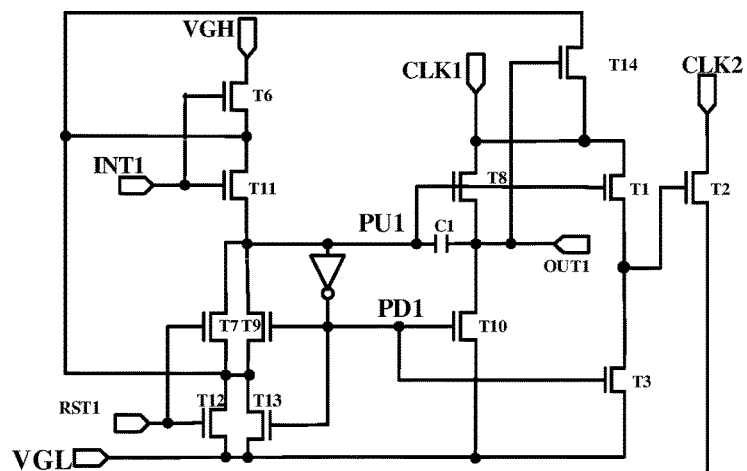
FIG. 7A is a circuit schematic diagram of a specific implementation example of the shift register unit as shown in FIG. 6.
Figure 7A:
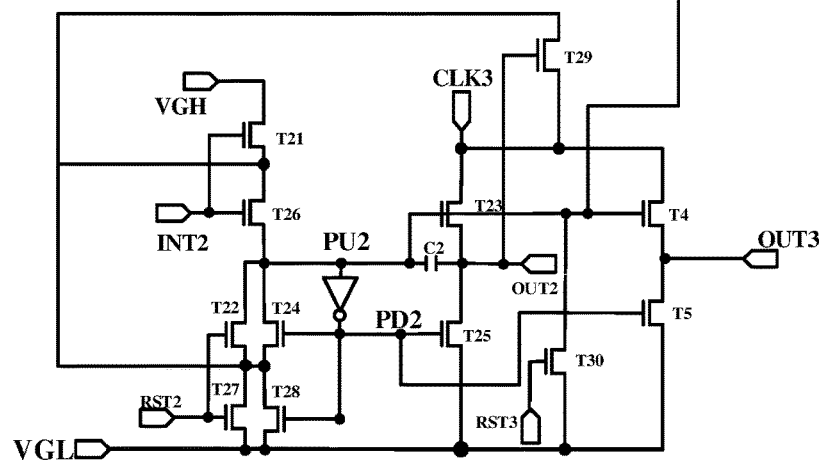
Figure 7B:
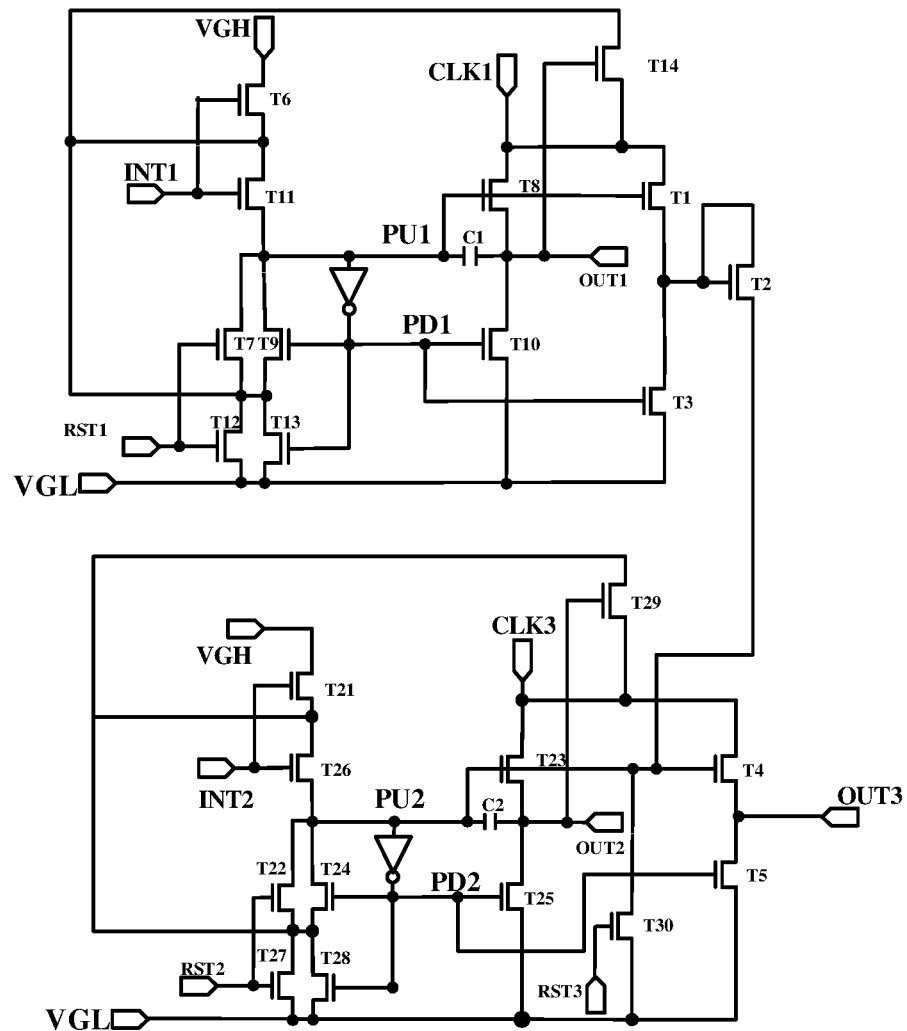
FIG. 7B is a circuit schematic diagram of another specific implementation example of the shift register unit as shown in FIG. 6.

For example, the shift register unit 10 as shown in FIG. 6 may be implemented as the circuit structure as shown in FIG. 7A or FIG. 7B in an example. The following description is illustrated by taking a case that each transistor is an N-type transistor, but it is not a limitation to the embodiment of the present disclosure. It should be noted that the first sub-shift register 100 may adopt the structure as shown in FIG. 4D, and the second sub-shift register 200 may adopt the structure as shown in FIG. 5D, which is not repeated herein again. For example, in this example, the output control signal includes the level of the first pull-up node PU1 and the first clock signal.

As shown in FIG. 7A, the output control circuit 300 may be implemented as a first transistor T1 and a second transistor T2, for example. A gate electrode of the first transistor T1 is connected to the first pull-up node PU1, a first electrode of the first transistor T1 is connected to the first clock signal terminal CLK1 to receive the first clock signal, and a second electrode of the first transistor T1 is connected to a gate electrode of the second transistor T2; and a first electrode of the second transistor T2 is connected to the second clock signal terminal CLK2 to receive the second clock signal, or the first electrode of the second transistor T2 is connected to the gate electrode of the second transistor T2 as shown in FIG. 7B. A second electrode of the second transistor T2 is connected to the second pull-up node PU2 of the second sub-shift register 200, so that the output control circuit 300 can control the level of the second pull-up node PU2 to control the second output terminal OUT2 and the third output terminal OUT3 to output the display output signal in the display phase and the random output signal in the blank phase.

For example, the output control circuit 300 may further include a third transistor T3. A gate electrode of the third transistor T3 is connected to the first pull-down node PD1, a first electrode of the third transistor T3 is connected to the gate electrode of the second transistor T2, and a second electrode of the third transistor T3 is connected to the first voltage terminal VGL to receive the first voltage, thereby realizing pull-down and reset of the gate electrode of the second transistor T2.

For example, the composite output circuit 400 may be implemented as a fourth transistor T4. A gate electrode of the fourth transistor T4 is connected to the second pull-up node PU2, a first electrode of the fourth transistor T4 is connected to the third clock signal terminal CLK3 to receive the third clock signal, and a second electrode of the fourth transistor T4 is connected to the third output terminal OUT3. For example, the third clock signal includes the display output signal and the random output signal. For example, the fourth transistor T4 is an output drive transistor connected to a load through a gate line, i.e., drives light emission of, for example, a pixel circuit connected to the gate line. Therefore, the fourth transistor T4 can be designed to be large in size, thereby having a large drive capability.

For example, the composite output circuit 400 may further include a fifth transistor T5. A gate electrode of the fifth transistor T5 is connected to the second pull-down node PD2, a first electrode of the fifth transistor T5 is connected to the third output terminal OUT3, and a second electrode of the fifth transistor T5 is connected to the first voltage terminal VGL to receive the first voltage, so that in a case where the fifth transistor T5 is turned on in response to the level of the second pull-down node PD2, the third output terminal OUT3 is connected to the first voltage terminal VGL, thereby realizing the reset of the third output terminal OUT3.

For example, the total reset circuit 500 may be implemented as a thirtieth transistor T30. A gate electrode of the thirtieth transistor T30 is connected to the third reset terminal RST3 to receive the third reset signal, a first electrode of the thirtieth transistor T30 is connected to the first voltage terminal VGL to receive the first voltage, and a second electrode of the thirtieth transistor T30 is connected to the second pull-up node PU2. For example, total reset circuits 500 of shift register units cascaded in the gate drive circuit are all connected to the third reset terminal RST3, so that through the third reset terminal RST3, second pull-up nodes PU2 of all the shift register units 10 can be reset, after the output of the display phase and the blank phase is finished.

Figure 7C:
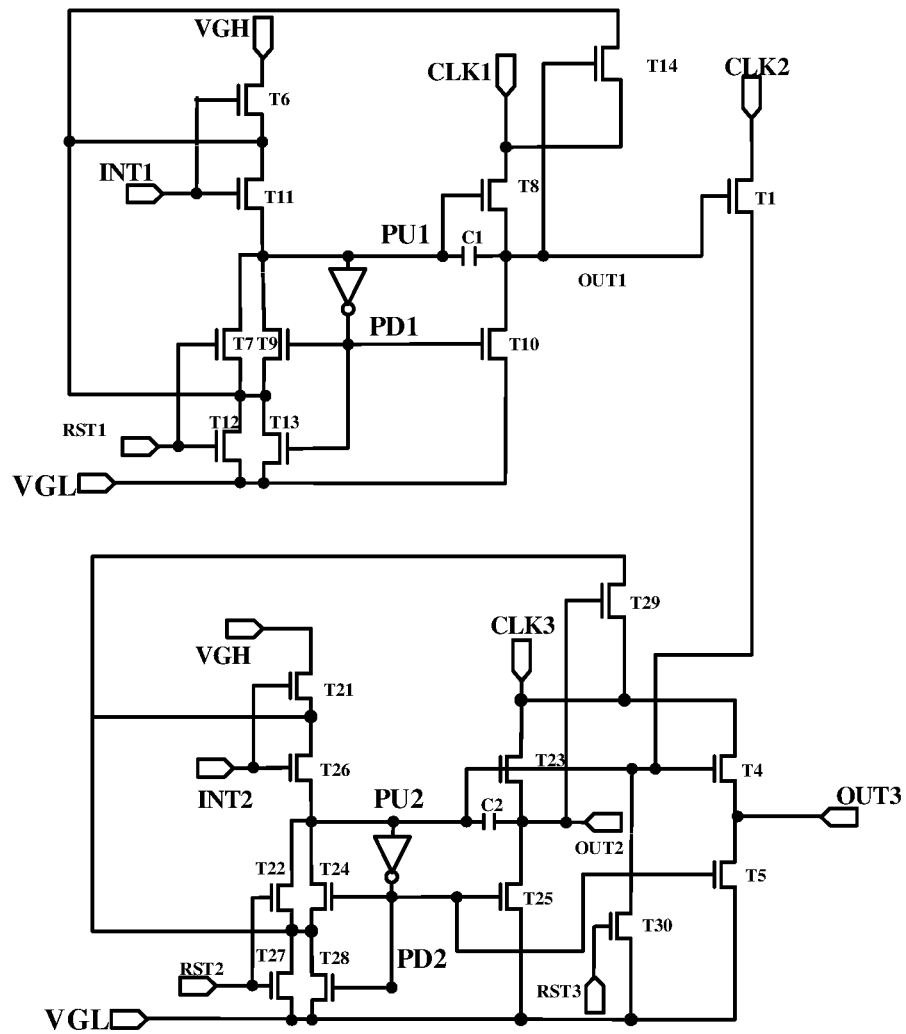
FIG. 7C is a circuit schematic diagram of yet another specific implementation example of the shift register unit as shown in FIG. 6.

For example, the shift register unit 10 as shown in FIG. 6 may be implemented to the circuit structure as shown in FIG. 7C in another example. For example, the circuit structure of the shift register unit 10 of this example is similar to the circuit structure of the shift register unit as shown in FIG. 7A, but the difference is that in this example, the output control signal includes the first clock signal output from the first output terminal OUT1, and the output control circuit 300 is implemented as a first transistor T1. A gate electrode of the first transistor T1 is connected to the first output terminal OUT1 of the first sub-shift register 100, a first electrode of the first transistor T1 is connected to the second clock signal terminal CLK2 to receive the second clock signal, and a second electrode of the first transistor T1 is connected to the second pull-up node PU2, that is, the first transistor T1 is turned on in response to the first clock signal output from the first output terminal OUT1 to control the level of the second pull-up node PU2.

Although only an example in which the shift register unit includes two or three output terminals is shown above, those skilled in the art can understand that more output terminals can be set according to the actual situation according to the description of the present disclosure, and the above example should not constitute a limitation on the protection scope of the present disclosure.

Figure 7D:
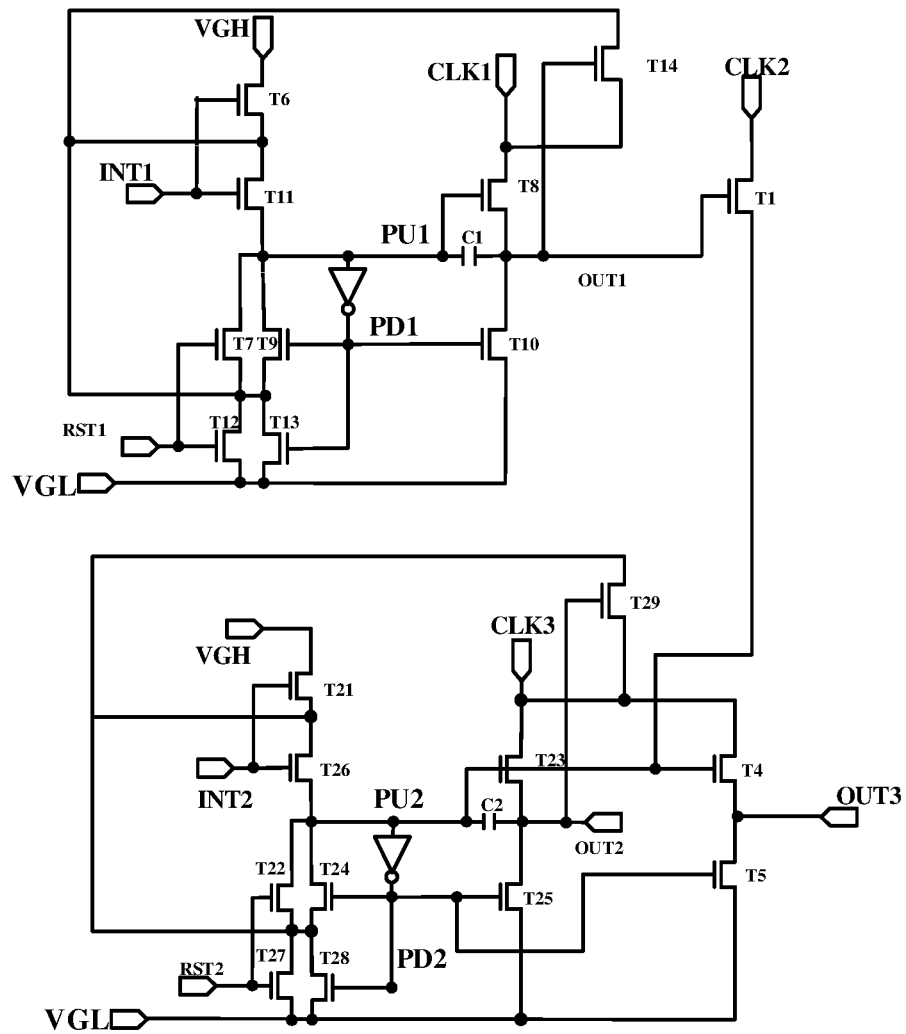
FIG. 7D is a circuit schematic diagram of a specific implementation example of the shift register unit as shown in FIG. 3.

FIG. 7D is a circuit schematic diagram of a specific implementation example of the shift register unit as shown in FIG. 3. For example, based on the circuit structure as shown in FIG. 7C, in the shift register unit, the total reset circuit 500 can be omitted, i.e., the thirtieth transistor T30 can be omitted, so the second pull-up node PU2 can reset and discharge through the first transistor T1 in a case where the first transistor T1 is turned on and the second clock signal terminal CLK2 provides a low level, thereby simplifying the circuit and reducing the occupied area of the circuit on the display panel. It should be noted that in the shift register unit as shown in FIG. 7A, the total reset circuit 500 may also be omitted, the principle of which is similar to the principle of the circuit structure as shown in FIG. 7C, and will not be repeated herein again.

Figure 7E:
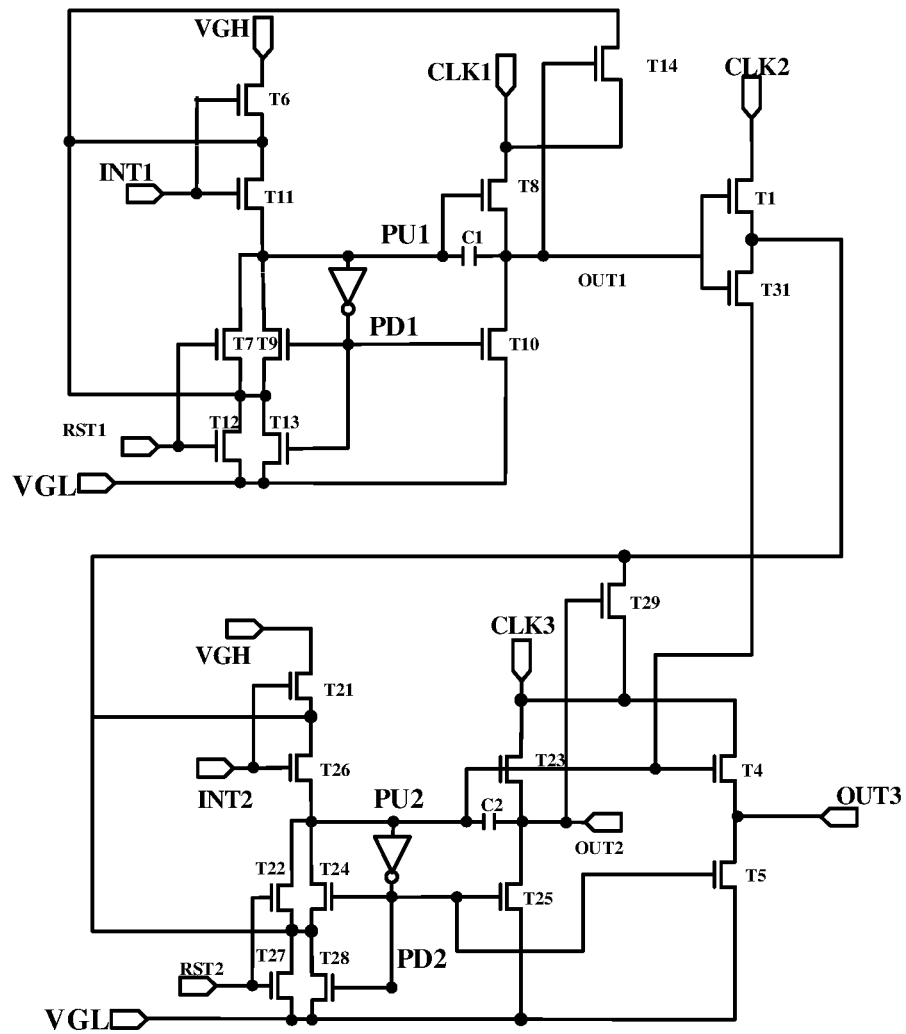
FIG. 7E is a circuit schematic diagram of another specific implementation example of the shift register unit as shown in FIG. 3.

FIG. 7E is a circuit schematic diagram of another specific implementation example of the shift register unit as shown in FIG. 3. For example, based on the circuit structure as shown in FIG. 7D, because the first transistor T1 is connected to the second pull-up node PU2, there may be a risk that the level of the second pull-up node PU2 leaks through the first transistor T1, so the second leakage protection circuit 270 in the shift register unit in this example may further include the thirty-first transistor T31. A gate electrode of the thirty-first transistor T31 is connected to the first output terminal OUT1, a first electrode of the thirty-first transistor T31 is connected to the second electrode of the first transistor T1 and the second electrode of the twenty-ninth transistor T29, and a second electrode of the thirty-first transistor T31 is connected to the second pull-up node PU2. It should be noted that the operation principle of the second leakage protection circuit in this example is similar to the operation principle of the first leakage protection circuit 170, and will not be repeated herein again. It should be noted that the transistors used in the embodiments of the present disclosure can be thin film transistors or field effect transistors or other switching devices with the same characteristics, and the embodiments of the present disclosure are all described by taking thin film transistors as examples. A source electrode and a drain electrode of the transistor used here can be symmetrical in structure, so the source electrode and the drain electrode can be structurally indistinguishable. In the embodiment of the present disclosure, in order to distinguish the two electrodes of the transistor except a gate electrode, one electrode is directly described as the first electrode and another electrode is described as the second electrode.

In addition, the transistors in the embodiments of the present disclosure are all described by taking an N-type transistor as an example. In this case, a first electrode of each transistor is the drain electrode, and a second electrode of the transistor is the source electrode. It should be noted that the present disclosure includes but is not limited to this case. For example, one or more transistors in the shift register unit provided by the embodiment of the present disclosure may also adopt P-type transistors. In this case, a first electrode of each transistor is the source electrode, a second electrode of the transistor is the drain electrode, and as long as polarities of the respective electrodes of selected-type transistors correspondingly be connected in accordance with the polarities of the respective electrodes of the respective transistors in the embodiment of the present disclosure. In a case where an N-type transistor is used, Indium Gallium Zinc Oxide (IGZO) can be used as an active layer of the thin film transistor. Compared with using Low Temperature Poly Silicon (LTPS) or amorphous silicon (such as hydrogenated amorphous silicon) as the active layer of the N-type thin film transistor, the size of the transistor can be effectively reduced and leakage current can be prevented.

It should be noted that in some embodiments of the present disclosure, for example, in a case where each circuit is implemented as P-type transistors, the term "pull-up" means discharging a node or an electrode of a transistor such that an absolute value of a level of the node or the electrode is reduced, thereby achieving an operation (such as, turn-on) of a corresponding transistor; and the term "pull-down" means charging a node or an electrode of a transistor such that an absolute value of a level of the node or the electrode is raised, thereby achieving an operation (such as, turn-off) of a corresponding transistor.

For another example, in a case where each circuit is implemented as N-type transistors, the term "pull-up" means charging a node or an electrode of a transistor such that an absolute value of a level of the node or the electrode is raised, thereby achieving an operation (such as, turn-on) of a corresponding transistor; and the term "pull-down" means discharging a node or an electrode of a transistor such that an absolute value of a level of the node or the electrode is reduced, thereby achieving an operation (such as, turn-off) of a corresponding transistor.

It should be noted that in the description of various embodiments of the present disclosure, the first pull-up node PU1, the first pull-down node PD1, the second pull-up node PU2, and the second pull-down node PD2 do not represent actual components, but represent junction points of related circuit connections in the circuit diagram.

According to the shift register unit provided by the above embodiment of the present disclosure, the output signal in the display phase and the output signal in the blank phase can be output to the gate line only through the second output circuit or the composite output circuit, so only one output drive transistor with a larger size is required to drive the load connected with the gate line, thereby contributing to the design of high resolution and narrow frame of the display panel.

Figure 8:
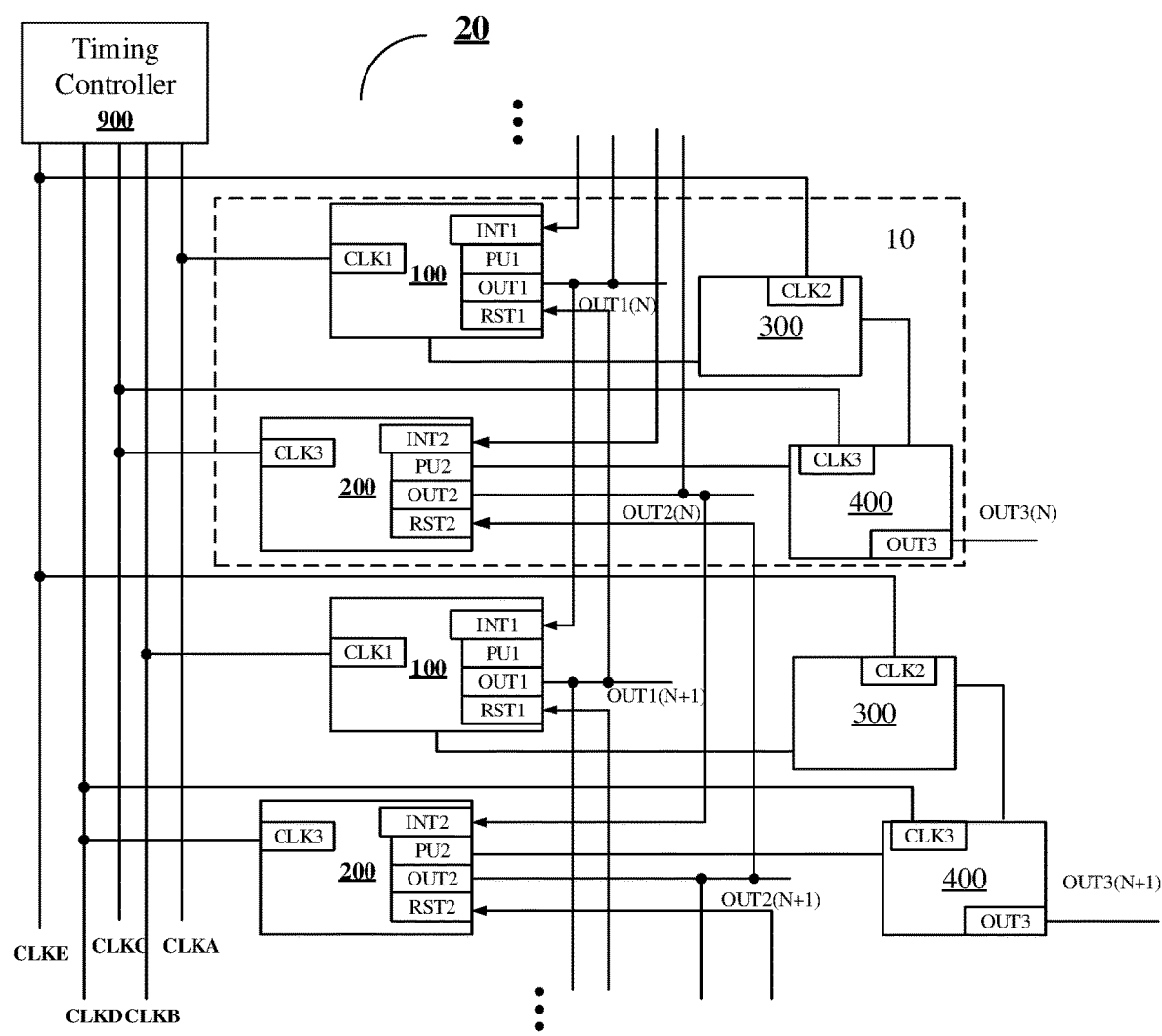
FIG. 8 is a schematic diagram of a gate drive circuit provided by some embodiments of the present disclosure.

The embodiment of the present disclosure provides a gate drive circuit 20. As shown in FIG. 8, the gate drive circuit 20 includes a first clock signal line CLKA, a second clock signal line CLKB, a third clock signal line CLKC, a fourth clock signal line CLKD, a fifth clock signal line CLKE, and a plurality of cascaded shift register units 10. For example, the shift register unit 10 may adopt any one of the shift register units provided in the above embodiment. The following will be described by taking a gate drive circuit including the shift register unit as shown in FIG. 3 as an example. The operation principle of other types of gate drive circuits is similar to this case and will not be repeated herein again.

For example, as shown in FIG. 8, each shift register unit 10 includes a first sub-shift register 100, a second sub-shift register 200, an output control circuit 300, and a composite output circuit 400. For example, each first sub-shift register 100 is connected to an output control circuit 300, which is connected to the second pull-up node PU2 of the second sub-shift register 200 and the composite output circuit 400.

The gate drive circuit 20 can be directly integrated on the array substrate of the display device by using the same process as that of the thin film transistor to realize the progressive scanning drive function. For example, in this example, the first sub-shift register 100 may adopt the circuit structure as shown in FIG. 4D, and the second-sub-shift register 200 may adopt the circuit structure as shown in FIG. 5D.

For example, as shown in FIG. 8, the first sub-shift register 100 in each shift register unit 10 further includes a first clock signal terminal CLK1, which is configured to be connected to the first clock signal line CLKA and the second clock signal line CLKB to receive clock signals. The first clock signal line CLKA is connected to a first clock signal terminal CLK1 of a (2m−1)-th (m is an integer greater than 0) stage of first sub-shift register, and the second clock signal line CLKB is connected to a first clock signal terminal CLK1 of a 2m-th stage of first sub-shift register. For example, the second sub-shift register 200 and the composite output circuit 400 in each shift register unit 10 further include third clock signal terminals CLK3, which are configured to be connected to the third clock signal line CLKC and the fourth clock signal line CLKD to receive clock signals. The third clock signal line CLKC is connected to third clock signal terminals CLK3 of a (2m−1)-th stage of second sub-shift register and composite output circuit 400, and the fourth clock signal line CLKD is connected to third clock signal terminals CLK3 of a 2m-th stage of second sub-shift register and composite output circuit 400. For example, the output control circuit 300 in each shift register unit 10 further includes a second clock signal terminal CLK2 and is configured to be connected to a fifth clock signal line CLKE to receive a second clock signal.

It should be noted that OUT1(N) as shown in FIG. 8 represents a first output terminal of an N-th (N is an integer greater than 1) stage of first sub-shift register, and OUT1(N+1) represents a first output terminal of a (N+1)-th stage of first sub-shift register OUT2(N) as shown in FIG. 8 represents a second output terminal of an N-th (N is an integer greater than 1) stage of second sub-shift register, and OUT2(N+1) represents a second output terminal of a (N+1)-th stage of second sub-shift register; and OUT3(N) as shown in FIG. 8 represents a (N+1)-th stage of third output terminal, and OUT3(N+1) represents a (N+1)-th stage of third output terminal. The reference numerals in the following embodiments are similar to this case and will not be repeated herein again.

For example, as shown in FIG. 8, the output control circuit 300 is connected between the first sub-shift register 100 and the second sub-shift register 200; except for a first stage of first sub-shift register, a first input terminal INT1 of each stage of the remaining first sub-shift registers is connected to a first output terminal OUT1 of a previous stage of first sub-shift register; except for a last stage of first sub-shift register, a first reset terminal RST1 of each stage of the remaining first sub-shift registers is connected to a first output terminal OUT1 of a next stage of first sub-shift register; except for a first stage of second sub-shift register, a second input terminal INT2 of each stage of the remaining second sub-shift registers is connected to a second output terminal OUT2 of a previous stage of second sub-shift register; and except for a last stage of second sub-shift register, a second reset terminal RST2 of each stage of the remaining second sub-shift registers is connected to a second output terminal OUT2 of a next stage of second sub-shift register.

For example, as shown in FIG. 8, the gate drive circuit 20 may further include a timing controller 900. For example, the timing controller 900 may be configured to be connected to the first clock signal line CLKA, the second clock signal line CLKB, the third clock signal line CLKC, the fourth clock signal line CLKD, and the fifth clock signal line CLKE to provide clock signals, trigger signals, and reset signals to each shift register unit.

For example, in a case where the shift register unit includes the total reset circuit 500, the gate drive circuit further includes a total reset line (not shown) configured to provide the third reset signal to the third reset terminal to reset all the second pull-up nodes of the gate drive circuit.

It should be noted that the gate drive circuit 10 may further include four, six or eight clock signal lines according to different configurations. The amount of clock signal lines depends on specific circumstances, and the embodiments of the present disclosure are not limited thereto here.

It should be noted that in a case where the gate drive circuit 20 provided in the embodiment of the present disclosure is used to drive a display panel, the gate drive circuit 20 may be disposed on one side of the display panel. For example, the display panel includes a plurality of rows of gate lines, and the output terminal of each shift register unit in the gate drive circuit 20 may be configured to be sequentially connected to the plurality of rows of gate lines for outputting gate scan signals. It should be noted that the gate drive circuits 20 may be provided on both sides of the display panel to realize double-sided driving, and the embodiment of the present disclosure does not limit the arrangement of the gate drive circuits 20. For example, the gate drive circuit 20 may be provided on one side of the display panel for driving odd rows of gate lines, while the gate drive circuit 20 may be provided on the other side of the display panel for driving even rows of gate lines.

Figure 9:
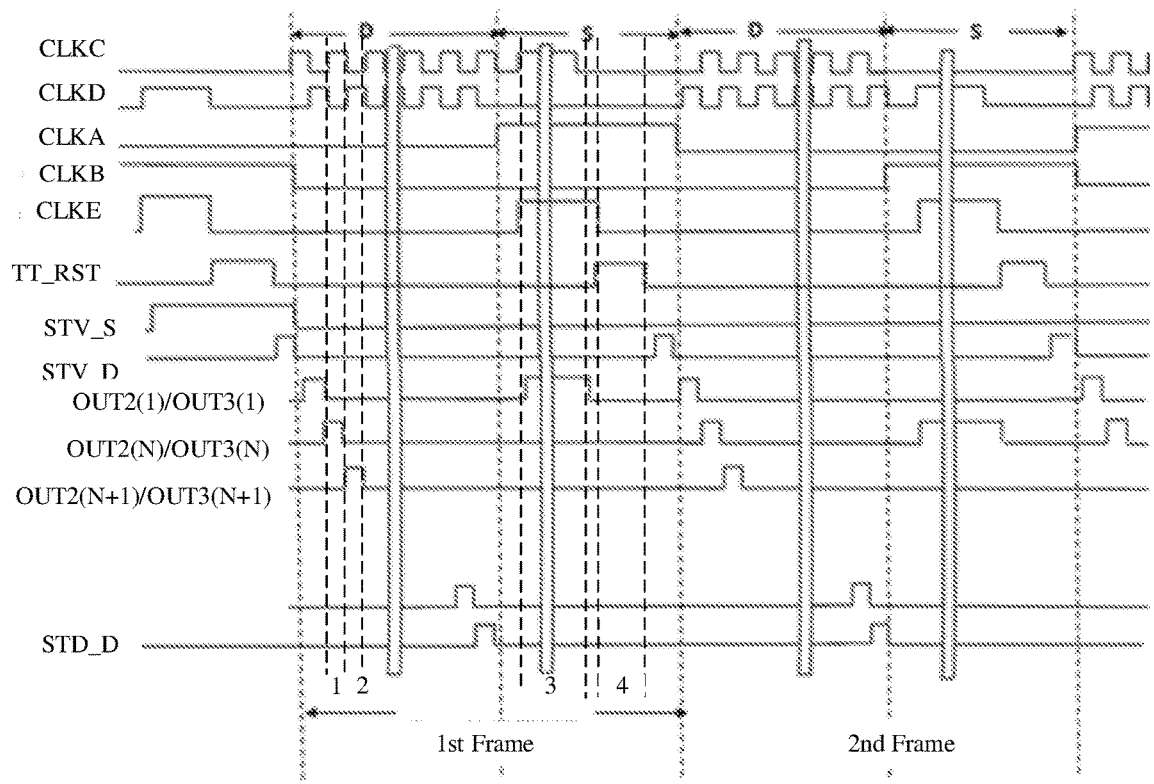
FIG. 9 is a signal timing chart in a case where the gate drive circuit as shown in FIG. 8 is in operation.

FIG. 9 is a signal timing chart in a case where the gate drive circuit as shown in FIG. 8 is in operation. The operation principle of the gate drive circuit 20 as shown in FIG. 8 will be described below with reference to the signal timing chart as shown in FIG. 9, and a case that each transistor is an n-type transistor is taken as an example to be described herein, but the embodiment of the present disclosure is not limited thereto.

As shown in FIG. 9, each frame includes two phases, which include a display phase D and a blank phase S, in total. In a display phase D of an X-th (X is an integer greater than 0) frame, the operation process of the shift register unit in the gate drive circuit is described as follows. It should be noted that the working process of the remaining frames is the same as this case and will not be repeated herein again.

In a first phase 1, the third clock signal line CLKC provides a high level, for example, the high level is a display output signal. Because the third clock signal terminals CLK3 of the N-th stage of second sub-shift register 200 and composite output circuit 400 are connected to the third clock signal line CLKC, the N-th stage of third clock signal terminals CLK3 are input a high level in this phase; also, because the second pull-up node PU2_N of the N-th stage of second sub-shift register is at a high level, under the control of the high level of the second pull-up node PU2_N, the high levels input by the third clock signal terminals CLK3 are output to the second output terminal OUT2(N) of the N-th stage of second sub-shift register 200 and the third output terminal OUT3(N) of the composite output circuit 400.

In a second phase 2, the fourth clock signal line CLKD provides a high level. Because the third clock signal terminals CLK3 of the (N+1)-th stage of second sub-shift register

200 and composite output circuit 400 are connected to the fourth clock signal line CLKD, the (N+1)-th stage of third clock signal terminals CLK3 are input a high level at this phase. Also, because the second pull-up node PU2_N+1 of the (N+1)-th stage of second sub-shift register is at a high level, under the control of the high level of the second pull-up node PU2_N+1, the high level input from the third clock signal terminal CLK3 is output to the second output terminal OUT2(N+1) of the (N+1)-th stage of second sub-shift register 200 and the third output terminal OUT3(N+1) of the composite output circuit 400.

In the blank stage S of the first frame, the operation process of the shift register unit in the gate drive circuit is described as follows. For example, in this example, for clarity and conciseness of description, N=2, it should be noted that the embodiments of the present disclosure are not limited to this case.

In a third phase 3, the first clock signal line CLKA provides a high level. Because the first clock signal terminal CLK1 of the first stage of first sub-shift register is connected to the first clock signal line CLKA, the first clock signal terminal CLK1 are input a high level in this phase. Meanwhile, the fifth clock signal line CLKE provides a high level. Because the second clock signal terminal CLK2 is connected to the fifth clock signal line CLKE, the second clock signal terminal CLK2 are input a high level at this phase. The third clock signal line CLKC provides a high level. Because the third clock signal terminals CLK3 of the second sub-shift register 200 and the composite output circuit 400 are connected to the third clock signal line CLKC, the third clock signal terminals CLK3 are input a high level at this phase. For example, the high level is a random output signal, which is different from the high level of the third clock signal line CLKC in the first phase. Because a first pull-up node PU1 of the first stage of first sub-shift register 100 is at a high level, the output control circuit 300 is turned on under the control of the high level of the first pull-up node PU1 and the high level of the first clock signal terminal CLK1, so that the high level provided by the second clock signal terminal CLK2 charges the second pull-up node PU2 of the first stage of second sub-shift register 200 to a high level. Under the control of the high level of the second pull-up node PU2, the high level input from the clock signal terminal CLK3 is output to the second output terminal OUT2(1) of the first stage of second sub-shift register 200 and the third output terminal OUT3(1) of the composite output circuit 400.

It should be noted that in a display phase of a second frame, the gate drive circuit 20 repeats the same operation as that of the display phase of the first frame, which is not repeated herein again. The difference is that in a blank phase of the second frame, because the fourth clock signal line CLKD provides a high level and the fourth clock signal line is connected to a first clock signal terminal of a second stage of first sub-shift register 100, the high level input by the clock signal terminal CLK4 is output to a second output terminal OUT2(2) of the second stage of second sub-shift register 200 and the third output terminal OUT3(2) of the composite output circuit 400 at this phase.

As described above, in a blank phase of each frame, the gate drive circuit outputs a drive signal for driving sense transistors in sub-pixel units in the display panel, and the drive signal is sequentially supplied row by row. For example, in the blank phase of the first frame, the gate drive circuit outputs a drive signal for driving a first row of sub-pixel units of the display panel, and in the blank phase of the second frame, the gate drive circuit outputs a drive signal for driving a second row of sub-pixel units of the display panel, and so on to complete row-by-row sequential compensation.

The following driving of the gate drive circuit in more phases, such as a third frame, a fourth frame, a fifth frame, and the like, can refer to the above description and will not be repeated herein again.

For example, in a case where the total reset circuit 500 is included, the above drive timing may further include a fourth phase 4.

In the fourth phase 4, the total reset line TT_RST provides a high-level signal. Because the total reset line TT_RST is connected to the third reset terminal RST3, the third reset terminal RST3 inputs a high level, such that the total reset circuit is turned on, so the second pull-up node PU2 is connected to the first voltage terminal VGL, thus resetting the second pull-up nodes of all shift register units.

For example, after the display phase of each frame ends, respective output terminals of the last stage of shift register unit can also be reset by the reset signal STD_D. For example, before entering the display phase, high-level signals may be supplied to respective input terminals of the first stage of shift register unit through the trigger signals STV_D and STV_S.

Figure 10:
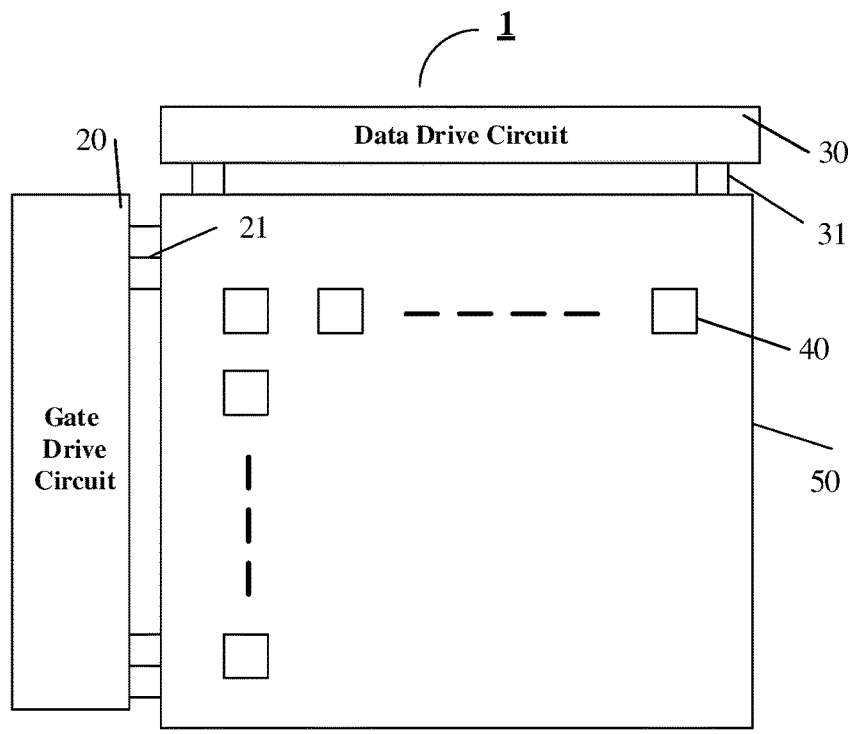
FIG. 10 is a schematic diagram of a display device provided by some embodiments of the disclosure.

Some embodiments of the present disclosure also provide a display device 1. As shown in FIG. 10, the display device 1 includes the gate drive circuit 20 provided in the embodiments of the present disclosure. The display device further includes a display panel 50 including a pixel array including a plurality of sub-pixel units 40, for example. For example, the display device 1 may further include a data drive circuit 30. The data drive circuit 30 is configured to provide data signals to the pixel array; and the gate drive circuit 20 is configured to provide gate scan signals to the pixel array. The data drive circuit 30 is electrically connected to the sub-pixel units 40 through data lines 31, and the gate drive circuit 20 is electrically connected to the sub-pixel units 40 through gate lines 21.

For example, as shown in FIGS. 8 and 10, the gate drive circuit 20 includes N cascaded shift register units 10, and second output terminals of the N cascaded shift register units 10 are respectively connected, in one-to-one correspondence, to N rows of sub-pixel units 40, to output display output signals line by line to the N rows of sub-pixel units in the display phase, to provide the scan signal G1 for controlling the switching transistor T1 as shown in FIG. 1A to be turned on, and to output a random output signal to one of the N rows of sub-pixel units in the blank phase to provide the compensation scan signal G2 for controlling the switching transistor T2 as shown in FIG. 1A to be turned on.

It should be noted that the display device 1 in this embodiment can be any product or component with a display function such as a liquid crystal panel, a liquid crystal television, a display, an OLED panel, an OLED television, an electronic paper display device, a mobile phone, a tablet computer, a notebook computer, a digital photo frame, a navigator, etc. The display device 1 may also include other conventional components such as a display panel, and the embodiments of the present disclosure are not limited thereto.

The technical effect of the display device 1 provided by the embodiment of the present disclosure may refer to the corresponding description of the gate drive circuit 20 in the above embodiment, and will not be described here again.

It should be noted that, for clarity and conciseness, an entire structure of the display device 1 is not provided. In order to realize the necessary functions of the display device, those skilled in the art can set other structures not shown according to specific application scenarios, and embodiments of the present invention are not limited to this case.

An embodiment of the present disclosure also provides a driving method of the gate drive circuit, such as a gate drive circuit for a display device. For example, the driving method of the gate drive circuit includes the following operations.

In the display phase, the second output terminal OUT2 of the second sub-shift register 200 outputs a display output signal.

In the blank phase, the second output terminal OUT2 of the second sub-shift register 200 outputs a random output signal.

For example, in a case where the shift register unit 10 includes the composite output circuit 400 and the third output terminal OUT3, the driving method of the gate drive circuit 20 further includes: in the display phase, the third output terminal OUT3 outputs a display output signal; and in the blank phase, the third output terminal OUT3 outputs a random output signal.

It should be noted that the detailed description and technical effect of the driving method can refer to the description of the working principle and technical effect of the gate drive circuit 20 in the embodiment of the present disclosure, which will not be repeated herein again.

The foregoing merely are exemplary embodiments of the disclosure, and not intended to define the scope of the disclosure, and the scope of the disclosure is determined by the appended claims.

What is claimed is:

1. A shift register unit, comprising a first sub-shift register, a second sub-shift register, and an output control circuit,
   wherein the first sub-shift register comprises a first output terminal, and is configured to output a first clock signal under control of a level of a first control node;
   the second sub-shift register comprises a second output terminal, and is configured so that the second output terminal outputs a display output signal in a display phase and outputs a random output signal in a blank phase under control of a level of a second control node;
   the output control circuit is connected to the first sub-shift register and the second control node, and is configured to control the level of the second control node under control of an output control signal;
   the output control signal comprises the level of the first control node and the first clock signal, and the output control circuit comprises a first transistor and a second transistor;
   a gate electrode of the first transistor is connected to the first control node, a first electrode of the first transistor is connected to a first clock signal terminal to receive the first clock signal, and a second electrode of the first transistor is directly connected to a gate electrode of the second transistor;
   a first electrode of the second transistor is connected to a second clock signal terminal to receive a second clock signal, or the first electrode of the second transistor is connected to the gate electrode of the second transistor; and
   a second electrode of the second transistor is connected to the second control node of the second sub-shift register.

2. The shift register unit according to claim 1, further comprising a composite output circuit and a third output terminal,
   wherein the composite output circuit is connected to the output control circuit, the second control node, and the third output terminal, and is configured so that the third output terminal outputs the display output signal in the display phase and outputs the random output signal in the blank phase under control of the level of the second control node.

3. The shift register unit according to claim 2, wherein the composite output circuit comprises a fourth transistor, wherein a gate electrode of the fourth transistor is connected to the second control node, a first electrode of the fourth transistor is connected to a third clock signal terminal to receive a third clock signal, and a second electrode of the fourth transistor is connected to the third output terminal, and
   wherein the third clock signal comprises the display output signal and the random output signal.

4. The shift register unit according to claim 3, wherein the composite output circuit further comprises a fifth transistor, wherein a gate electrode of the fifth transistor is connected to a fourth control node, a first electrode of the fifth transistor is connected to the third output terminal, and a second electrode of the fifth transistor is connected to a first voltage terminal to receive a first voltage.

5. The shift register unit according to claim 1, wherein the output control circuit further comprises a third transistor, wherein a gate electrode of the third transistor is connected to a third control node, a first electrode of the third transistor is connected to the gate electrode of the second transistor, and a second electrode of the third transistor is connected to a first voltage terminal to receive a first voltage.

6. The shift register unit according to claim 1, wherein the first sub-shift register comprises a first input circuit, a first control node reset circuit, and a first output circuit, wherein,
   the first input circuit is configured to charge the first control node in response to a first input signal;
   the first control node reset circuit is configured to reset the first control node in response to a first reset signal; and
   the first output circuit is configured to output the first clock signal to the first output terminal under control of the level of the first control node.

7. The shift register unit according to claim 6, wherein the first sub-shift register further comprises a first inverter circuit, a first control node noise reduction circuit, and a first output noise reduction circuit, wherein,
   the first inverter circuit is configured to control a level of a third control node under control of the level of the first control node;
   the first control node noise reduction circuit is configured to perform noise reduction on the first control node under control of the level of the third control node; and
   the first output noise reduction circuit is configured to perform noise reduction on the first output terminal under control of the level of the third control node.

8. The shift register unit according to claim 7, wherein the first sub-shift register further comprises a first leakage protection circuit, wherein the first leakage protection circuit is configured to maintain a high potential of the first control node under control of the first clock signal output from the first output terminal.

9. The shift register unit according to claim 8, wherein the first leakage protection circuit comprises an eleventh transistor, a twelfth transistor, a thirteenth transistor, and a fourteenth transistor, wherein,
   a gate electrode of the eleventh transistor is connected to a first input terminal to receive the first input signal, a first electrode of the eleventh transistor is connected to a second electrode of the fourteenth transistor, and a second electrode of the eleventh transistor is connected to the first control node;

a gate electrode of the twelfth transistor is connected to a first reset terminal to receive the first reset signal, a first electrode of the twelfth transistor is connected to the second electrode of the fourteenth transistor, and a second electrode of the twelfth transistor is connected to a first voltage terminal to receive a first voltage;

a gate electrode of the thirteenth transistor is connected to the third control node, a first electrode of the thirteenth transistor is connected to the second electrode of the fourteenth transistor, and a second electrode of the thirteenth transistor is connected to the first voltage terminal to receive the first voltage; and a gate electrode of the fourteenth transistor is connected to the first output terminal, and a first electrode of the fourteenth transistor is connected to the first clock signal terminal to receive the first clock signal.

10. The shift register unit according to claim 1, wherein the second sub-shift register comprises a second input circuit, a second control node reset circuit, and a second output circuit, wherein, the second input circuit is configured to charge the second control node in response to a second input signal;

the second control node reset circuit is configured to reset the second control node in response to a second reset signal;

the second output circuit is configured to output a third clock signal to the second output terminal under control of the level of the second control node; and wherein the third clock signal comprises the display output signal and the random output signal.

11. The shift register unit according to claim 10, wherein the second sub-shift register comprises a second inverter circuit, a second control node noise reduction circuit, and a second output noise reduction circuit, wherein, the second inverter circuit is configured to control a level of a fourth control node under control of the level of the second control node;

the second control node noise reduction circuit is configured to perform noise reduction on the second control node under control of the level of the fourth control node; and the second output noise reduction circuit is configured to perform noise reduction on the second output terminal under control of the level of the fourth control node.

12. The shift register unit according to claim 11, wherein the second sub-shift register further comprises a second leakage protection circuit, wherein the second leakage protection circuit is configured to maintain a high potential of the second control node under control of the third clock signal output from the second output terminal.

13. The shift register unit according to claim 12, wherein the second leakage protection circuit comprises a twenty-sixth transistor, a twenty-seventh transistor, a twenty-eighth transistor, and a twenty-ninth transistor, wherein a gate electrode of the twenty-sixth transistor is connected to a second input terminal to receive the second input signal, a first electrode of the twenty-sixth transistor is connected to a second electrode of the twenty-ninth transistor, and a second electrode of the twenty-sixth transistor is connected to the second control node;

a gate electrode of the twenty-seventh transistor is connected to a second reset terminal to receive the second reset signal, a first electrode of the twenty-seventh transistor is connected to the second electrode of the twenty-ninth transistor, and a second electrode of the twenty-seventh transistor is connected to a first voltage terminal to receive a first voltage;

a gate electrode of the twenty-eighth transistor is connected to the fourth control node, a first electrode of the twenty-eighth transistor is connected to the second electrode of the twenty-ninth transistor, and a second electrode of the twenty-eighth transistor is connected to the first voltage terminal to receive the first voltage; and a gate electrode of the twenty-ninth transistor is connected to the second output terminal, and a first electrode of the twenty-ninth transistor is connected to a third clock signal terminal to receive the third clock signal.

14. The shift register unit according to claim 1, further comprising a total reset circuit, wherein the total reset circuit is configured to reset the second control node under control of a third reset signal.

15. The shift register unit according to claim 14, wherein the total reset circuit comprises a thirtieth transistor, wherein a gate electrode of the thirtieth transistor is connected to a third reset terminal to receive the third reset signal, a first electrode of the thirtieth transistor is connected to a first voltage terminal to receive a first voltage, and a second electrode of the thirtieth transistor is connected to the second control node.

16. A gate drive circuit, comprising a plurality of cascaded shift register units according to claim 1, wherein the output control circuit is electrically connected to the first sub-shift register and the second sub-shift register;

except for a first stage of first sub-shift register, a first input terminal of each stage of remaining first sub-shift registers is connected to a first output terminal of a previous stage of first sub-shift register;

except for a last stage of first sub-shift register, a first reset terminal of each stage of remaining first sub-shift registers is connected to a first output terminal of a next stage of first sub-shift register;

except for a first stage of second sub-shift register, a second input terminal of each stage of remaining second sub-shift registers is connected to a second output terminal of a previous stage of second sub-shift register; and except for a last stage of second sub-shift register, a second reset terminal of each stage of remaining second sub-shift registers is connected to a second output terminal of a next stage of second sub-shift register.

17. A display device, comprising the gate drive circuit according to claim 16.

18. The display device according to claim 17, further comprising a display panel, wherein the display panel comprises a plurality of sub-pixel units arranged in an array, and the array comprises N rows, wherein the gate drive circuit comprises N cascaded shift register units, and second output terminals of the N cascaded shift register units are respectively connected, in one-to-one correspondence, to the N rows of sub-pixel units so as to output display output signals to the N rows of sub-pixel units line by line in the display phase and output random output signals to one of the N rows of sub-pixel units in the blank phase; and wherein N is an integer greater than 1.

* * * * *